United States Patent
Rhodes

(10) Patent No.: US 7,148,528 B2
(45) Date of Patent: Dec. 12, 2006

(54) PINNED PHOTODIODE STRUCTURE AND METHOD OF FORMATION

(75) Inventor: Howard E. Rhodes, Boise, ID (US)

(73) Assignee: Micron Technology, Inc., Boise, ID (US)

(*) Notice: Subject to any disclaimer, the term of this patent is extended or adjusted under 35 U.S.C. 154(b) by 23 days.

(21) Appl. No.: 10/695,160

(22) Filed: Oct. 29, 2003

(65) Prior Publication Data
US 2005/0001248 A1 Jan. 6, 2005

Related U.S. Application Data

(60) Provisional application No. 60/483,895, filed on Jul. 2, 2003.

(51) Int. Cl.
*H01L 31/062* (2006.01)
(52) U.S. Cl. ............... 257/292; 257/431; 257/E31.032
(58) Field of Classification Search ................. 257/292
See application file for complete search history.

(56) References Cited

U.S. PATENT DOCUMENTS

| | | | | |
|---|---|---|---|---|
| 5,006,477 A | * | 4/1991 | Farb | 438/231 |
| 5,430,321 A | * | 7/1995 | Effelsberg | 257/463 |
| 5,580,663 A | * | 12/1996 | Campisano et al. | 428/446 |
| 5,962,882 A | * | 10/1999 | Sin | 257/222 |
| 6,287,886 B1 | * | 9/2001 | Pan | 438/57 |
| 6,407,417 B1 | * | 6/2002 | Nagata et al. | 257/292 |
| 6,417,023 B1 | * | 7/2002 | Suzuki et al. | 438/73 |
| 6,521,925 B1 | * | 2/2003 | Mori et al. | 257/292 |
| 2002/0047115 A1 | * | 4/2002 | Kawakami et al. | 257/22 |
| 2002/0048837 A1 | * | 4/2002 | Burke et al. | 438/48 |
| 2002/0185700 A1 | * | 12/2002 | Coffa et al. | 257/431 |
| 2004/0173799 A1 | * | 9/2004 | Patrick | 257/72 |

* cited by examiner

*Primary Examiner*—Tu-Tu Ho
(74) *Attorney, Agent, or Firm*—Dickstein Shapiro LLP

(57) ABSTRACT

An imager having a photodiode with a shallow doping profile with respect to the top surface of a substrate is disclosed. An imager with a graded pinned surface layer, self-aligned to a gate stack is provided. A photodiode with a shallow doping profile with respect to the top surface of a substrate and a graded pinned surface layer, self-aligned to a gate stack is provided. These photodiodes exhibit reduced image lag, transfer gate leakage, and photodiode dark current generation.

35 Claims, 18 Drawing Sheets

US 7,148,528 B2

PINNED PHOTODIODE STRUCTURE AND METHOD OF FORMATION

CROSS REFERENCE TO RELATED APPLICATION

This non-provisional application claims the benefit of provisional application Ser. No.: 60/483,895, filed Jul. 2, 2003, which is hereby incorporated by reference.

FIELD OF THE INVENTION

The present invention relates to the field of semiconductor devices and, in particular, to a pinned photodiode used in an imaging device and a method of forming the pinned photodiode.

BACKGROUND OF THE INVENTION

The semiconductor industry currently uses different types of semiconductor-based imagers, including charge coupled devices (CCD) and CMOS imager devices. Because of the inherent limitations in CCD technology, CMOS imagers have been increasingly used as low-cost imaging devices.

A CMOS image sensor circuit includes a focal plane array of pixel cells, each one of the cells including a photoconversion device, for example, a photogate, photoconductor, or a photodiode for accumulating photogenerated charge in a doped portion of the substrate. A readout circuit is connected to each pixel cell and includes at least an output transistor, which receives photogenerated charges, typically from a floating diffusion region, and produces an output signal which is periodically read-out through a row select access transistor. The imager may optionally include a transistor for transferring charge from the photoconversion device to the floating diffusion region or the floating diffusion region may be directly connected to or part of the photoconversion device. A transistor is also typically provided for resetting the floating diffusion region to a predetermined charge level before it receives the photoconverted charges.

In a conventional CMOS imager, the active elements of a pixel cell perform the necessary functions of: (1) photon to charge conversion; (2) accumulation of image charge; (3) transfer of charge to the floating diffusion node; (4) resetting the floating diffusion node to a known state before the transfer of charge to it; (5) selection of a pixel for readout; and (6) output and amplification of signals representing the reset state and a pixel charge signal. Photo-charge may be amplified when it moves from the initial charge accumulation region to the floating diffusion node through a transfer transistor. The charge at the floating diffusion node is converted to a pixel output voltage by the source follower output transistor.

A known three-transistor (3T) CMOS active pixel sensor (APS) design used in many applications contains a photodiode for producing charges which are stored at a diffusion region, a reset transistor for resetting the diffusion region charge, a source follower transistor having a gate connected to the diffusion region for producing an output signal, and a row select transistor for selectively connecting the source follower transistor to a column line of a pixel array. In a four-transistor (4T) CMOS configuration, a transfer transistor is employed to transfer charges from the photodiode to the diffusion region.

A schematic top view of a semiconductor wafer fragment of an exemplary CMOS sensor pixel four-transistor (4T) cell 10 is illustrated in FIG. 1. The CMOS sensor pixel cell 10 includes a photogenerated charge collection region 21, in a doped portion of the wafer substrate, for collecting charges generated by light incident on the pixel cell 10. This region 21 is formed as a pinned photodiode 11 (FIG. 2). The photodiode 11 is "pinned" because the potential in the photodiode 11 is pinned to a constant value when the photodiode 11 is fully depleted. It should be understood, however, that the CMOS sensor pixel cell 10 may include a photogate, a photoconductor, or other photon-to-charge converting device, in lieu of a pinned photodiode 11 as the initial charge collection region 21.

The pixel cell 10 of FIG. 1 has a transfer transistor with gate 30 for transferring photoelectric charges from the charge collection region 21 to a sensing node 25, typically known as a floating diffusion region. The sensing node 25 is electrically connected to the gate 50 of an output source follower transistor. The source follower transistor provides an output signal to a row select access transistor having gate 60 for selectively gating the output signal to terminal 32'. A reset transistor having gate 40 resets the sensing node 25 to a predetermined voltage before charge is transferred thereto from the charge collection region 21.

FIG. 2 illustrates a cross-sectional view of a conventionally formed pinned photodiode 11 taken along line 2–2' of the exemplary CMOS pixel cell 10 of FIG. 1.

The exemplary pixel 10 of FIG. 2 includes pinned photodiode 11 having charge collection region 21 formed within a semiconductor substrate 2. The pinned photodiode 11 has a photosensitive p-n junction region comprising a doped p+ region 4 and a n-type photodiode region 35 within a p-type region 6. The p-type region 6 is formed within semiconductor substrate 2. The two p-type regions 4, 6 cause the n-type photodiode region 35 to be fully depleted at a pinning voltage. Impurity doped source/drain regions 5, 25 having n-type conductivity are provided about the transistor gates 30 and 40. The floating diffusion region 25 adjacent to transfer gates 30, 40 is a common source/drain region for the transfer transistor having gate 30 and the reset transistor having gate 40. FIG. 2 also illustrates optional p-well implant regions 6A and a TEOS oxide spacer layer 95 that is etched to form sidewall spacers 95A.

In a typical CMOS image sensor, trench isolation regions 8 formed in a p-type region 6 and adjacent to the charge collection region 21, are used to isolate adjacent pixels. The order of process steps in forming the various structures of pixel cell 10 may be varied as is required or convenient for a particular process flow.

A transparent insulating layer 99 is typically formed over the pixel cell 10. Conventional processing steps are then carried out to form, for example, metal conductor 15 in the insulating layer to provide an electrical connection/contact to the floating diffusion region 25, and other wiring to connect gate lines and other connections in pixel 10. For example, the entire substrate surface may be covered with a passivation layer of e.g., silicon dioxide, BSG, PSG, or BPSG, as a transparent insulating layer 99, which is planarized and etched to provide contact holes, which are then metallized to provide contacts to diffusion node 25.

In conventional CMOS image sensors, electrons are generated from incident light and are accumulated in the n-type photodiode region 35. These charges are transferred to the floating diffusion region 25 by the gate 30 of the transfer transistor. The source follower transistor 50 produces an output signal from the transferred charges.

A maximum output signal is proportional to the number of electrons extracted from the n-type photodiode region 35. The maximum output signal increases with increased electron capacitance of the pinned photodiode 11. The electron capacity of the pinned photodiode 11 typically depends on the doping levels and the dopants implanted to form regions 4, 6, 35. In particular, regions 4 and 35 dominate the pinned photodiode's 11 capacitance. Accordingly, increasing the pinned photodiode's 11 capacitance is useful to allow capture of greater levels of photoconverted charges.

One major concern with conventional CMOS image pixels is reducing the generation of dark current. Dark current is generally attributed to leakage in the n-type photodiode region 35, which is strongly dependent on the doping implantation conditions of the photodiode 11. In particular, high dopant concentrations in p-type electrical connection region 23 typically increases dark current.

Other sources of dark current include unwanted electrons from peripheral circuits and electron generation from infrared photons. Dark current is also caused by current generated from trap sites inside or near the photodiode depletion region; band-to-band tunneling induced carrier generation as a result of high fields in the depletion region; junction leakage coming from the lateral sidewall of the photodiode; and leakage from isolation corners, for example, stress induced and trap assisted tunneling.

In CMOS imagers, the design of the photodiode is of particular concern in suppressing dark current. Currently, there are a number of common problems associated with conventionally formed photodiodes, such as the pinned photodiode 11 of FIG. 2. For instance, FIG. 3 illustrates a conventional structure and method of forming the pinned photodiode 11 of FIG. 2, and problems associated with such structure and method.

Conventionally, pinned photodiode 11 is formed after deposition of a spacer insulator oxide layer 95 such as TEOS. For instance, FIG. 3 illustrates deposition of a TEOS oxide spacer layer 95 and resist 96 over the transfer transistor gate 30 and reset transistor gate 40. Next, the pinned photodiode 11 would be formed with a doped p+ region 4 and an n-type region 35. The doped p+ region 4 and the n-type region 35 would be formed by implanting through the TEOS oxide layer 95.

Typically, the doped p+ region 4 was formed by a high energy vertical dose implant which places the doped p+ region 4 near the edge of the transfer gate's spacer 95. This is a fairly high-energy implant requiring an implant energy greater than 20 keV and results in implant straggle i.e., wide distribution in the p-type region profile as a result of oxidation diffusion from subsequent processes.

The n-type region 35 was typically formed with three vertical implants employing phosphorus as the n-type dopant ion. Similar to the formation of the doped p+ region 4, the n-type region 35 would also exhibit implant straggle as a result of oxidation diffusion. The doped p+ region 4 and the n-type region 35 form an area called the critical overlap region 22. This critical overlap region 22, in effect, acts as a barrier at the edge of the transfer gate 30 since the doped p+ region and n-type region 35 are not sharply defined due to diffusion. The critical overlap region 22 reduces the ability of the n-type region 35 to effectively transfer charge to the transfer gate 30.

It is well-known that the transfer gate 30 of a CMOS imager is a critical device for optimization. The transfer gate 30 is influenced by the charge transfer efficiency (CTE) and image lag due to barrier formation. As a result, barriers and wells formed in the photodiode region 11 and transfer gate overlap region 22 affect the CTE which results in image lag. Accordingly, the critical overlap region 22 is important for optimization in four transistor pixel cell designs.

One prior solution for improving the critical overlap region 22 was to vertically implant the doped p+ region 4 implant spaced away from the edge of the transfer gate 30, using the insulator 95 sidewall, thereby reducing the critical overlap region's 22 influence. However, the barrier at the transfer gate's edge 30 still blocked complete charge transfer and photographic images still suffered from low-light image lag. Moreover, diffusion of both doped p+ region 4 and n-type region 35 remained, which is undesirable. Still further, the thickness of insulator 95 also set the transistor gate's 30 spacer thickness. It would be desirable to independently set the transistor spacer width and the spacing of the p+ implant from the transfer gate's edge 30.

Another problem associated with the pinned photodiode 11 of FIG. 3 is that the n-type collection region 35 is typically formed by three deep n-type implants into p-type region 6. These deep implants are conducted with an implant energy of 45 keV, 110 keV and 210 keV, respectively. As a result, the n-type collection region 35 is formed with a long neck 24 (FIGS. 2 and 3). Since the n-type region 35 is formed deep within p-type region 6, transfer gate 30 leakage occurs due to punch-through currents. In essence, the captured electron energy from the n-type collection region 35 moves across the p-type region 6A underneath the transfer gate 30. As a result, the current flow is not completely controlled by the transfer gate 30.

Another problem associated with the conventional pinned photodiode 11 of FIG. 3 is charge capacity loss and variation from sensor to sensor. Charge capacity is the measure of the electrons storage capacity of the photodiode sensor. For instance, the doped p+ region 4 and n-type region 35 interact with each other through diffusion and implant straggle resulting from the high energy implants used to form the regions 4 and 35. This mutual compensation results in photosensor performance variation. In other words, charge capacity loss may occur when a higher concentration of p-type dopants are used in the surface of the pinned photodiode 11 and diffuse into the n-type dopant 35 region, thereby compensating it and causing a reduction in charge capacity. The mutual diffusion and implant straggle result in an uncontrolled implant region at the transfer gate's edge 30 that gives rise to barrier and lag issues.

A final problem associated with the conventional pinned photodiode 11 of FIG. 3 is that the doped p+ region 4 and the n-type region 35 set the pinning voltage ($V_{pin}$) of pixel cell 10. The sharpness of the transition from the doped p+ region 4 to the n-type region 35 ultimately sets the capacitance of the photodiode 11. The pinned photodiode 11 has two p-type regions 4, 6 having the same potential so that the n-type collection region 35 is fully depleted at a given $V_{pin}$. When the transfer gate 30 is operated, photo-generated charge is transferred from the n-type collection region 35 to the floating diffusion region 25. A complete transfer of charge is possible when a voltage on the floating diffusion region 25 remains above $V_{pin}$ while the pinned photodiode 11 functions at a voltage below $V_{pin}$. An incomplete transfer of charge results in image lag. As a result, due to diffusion, high implant energies, and implant straggle, the n-type region 35 does not have a sharp profile in the substrate but rather a broad one.

There is needed, therefore, an improved active pixel photosensor for use in a CMOS imager that is resistant to dark current, has improved photodiode capacitance, eliminates or reduces barriers at an adjacent gate's edge (such as a transfer gate), eliminates or reduces image lag, and separates the optimization of the photodiode implant locations from the transistor spacer defined locations. Thus, a pinned photodiode structure and its method of formation is needed to reduce or eliminate the problems associated with the pinned photodiodes currently in the semiconductor industry.

BRIEF SUMMARY OF THE INVENTION

In one aspect, the invention provides a pinned photodiode for an imager cell and a method of forming the photodiode with a shallow pinned surface layer near an adjacent transistor gate. The shallow pinned surface layer with sub-regions of varying dopant concentrations can be further improved using dual surface implants of varying strength. The pinned surface layer is first formed with an angled implant from about 2 degrees to about 30 degrees forming a first sub-region. Next, a second angled implant is conducted at an angle from about 0 degrees to about 15 degrees forming a second sub-region. The second implanted region has a lower dopant concentration than the first implanted region resulting in a shallow doping profile next to an adjacent gate. A third sub-region is formed that does not have any photodiode dopant ions.

In another aspect, the invention provides a pinned photodiode with a shallower doping profile than conventionally formed photodiodes. A pinned surface layer is formed with an angled implant before or after source/drain oxidation rather than through a spacer insulator oxide layer as is currently done for conventional photodiodes. The shallow pinned surface implant is preferably done with $BF_2$ or indium ("In") rather than $B^{11}$ ("Boron"). The charge collection region is also formed with a shallow, low energy angled implant employing a low diffusivity n-type dopant ion using arsenic or antimony preferable to phosphorus to achieve a shallow self-aligned implant with respect to an adjacent gate.

These and other features of the invention will be more apparent from the following detailed description that is provided in connection with the accompanying drawings and illustrated exemplary embodiments of the invention.

DETAILED DESCRIPTION OF THE INVENTION

In the following detailed description, reference is made to the accompanying drawings which form a part hereof, and in which is shown by way of illustration specific embodiments in which the invention may be practiced. These embodiments are described in sufficient detail to enable those skilled in the art to practice the invention, and it is to be understood that other embodiments may be utilized, and that structural, logical and electrical changes may be made without departing from the spirit and scope of the present invention.

The terms "wafer" and "substrate" are to be understood as a semiconductor-based material including silicon, silicon-on-insulator (SOI) or silicon-on-sapphire (SOS) technology, doped and undoped silicon semiconductors, epitaxial layers of silicon supported by a base semiconductor foundation, and other semiconductor structures.

Furthermore, when reference is made to a "wafer" or "substrate" in the following description, previous process steps may have been utilized to form regions or junctions in or over the base semiconductor structure or foundation. In addition, the semiconductor need not be silicon-based, but could be based on silicon-germanium, silicon-on-insulator, silicon-on-sapphire, germanium, or gallium arsenide, among others.

The term "pixel" refers to a picture element unit cell containing a photosensor and transistors for converting electromagnetic radiation to an electrical signal. For purposes of illustration, a representative pixel is illustrated in the figures and description herein and, typically, fabrication of all pixels in an imager array will proceed simultaneously in a similar fashion.

For purposes of the present disclosure, the term "angled implantation" or "angled implant" is defined as an implantation conducted at incidence angles with respect to the substrate other than a right angle, that is, at angles other than 0 degrees with respect to the substrate, where a 0 degree implantation is defined to be perpendicular to the substrate. Thus, the term "angled implantation" or "angled implant" refers to implantation conducted at incidence angles with the substrate between 0 degrees to less than 90 degrees.

Moreover, for purposes of the present disclosure, the term "photodiode p-type implantation" or "photodiode implantation" is defined as a selective implantation that reaches or affects the photodiode region through techniques well-known in the art. Thus, the term "photodiode p-type implantation" or "photodiode implantation" refers to implantation conducted with a resist, mask or other technique in the art that allows for implantation of the photodiode region.

It should also be appreciated that although the present invention is described below as being employed by a CMOS imager, the methods and structures of the present invention can also be used in other imagers with equal effectiveness, such as a CCD imager.

Figure 4:
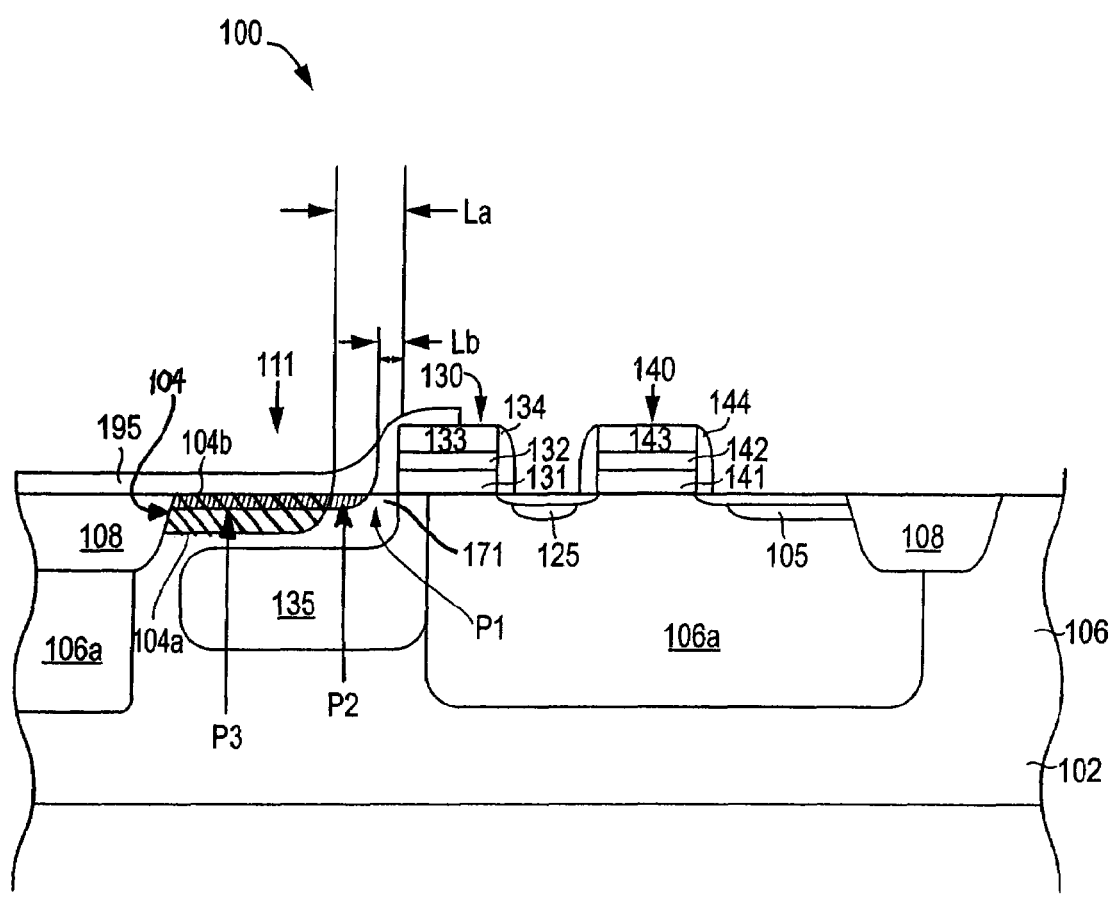
FIG. 4 is a cross-sectional view of a CMOS imager pixel cell illustrating a photodiode and graded pinned surface layer formed in accordance with an exemplary embodiment of the invention.
Figure 6:
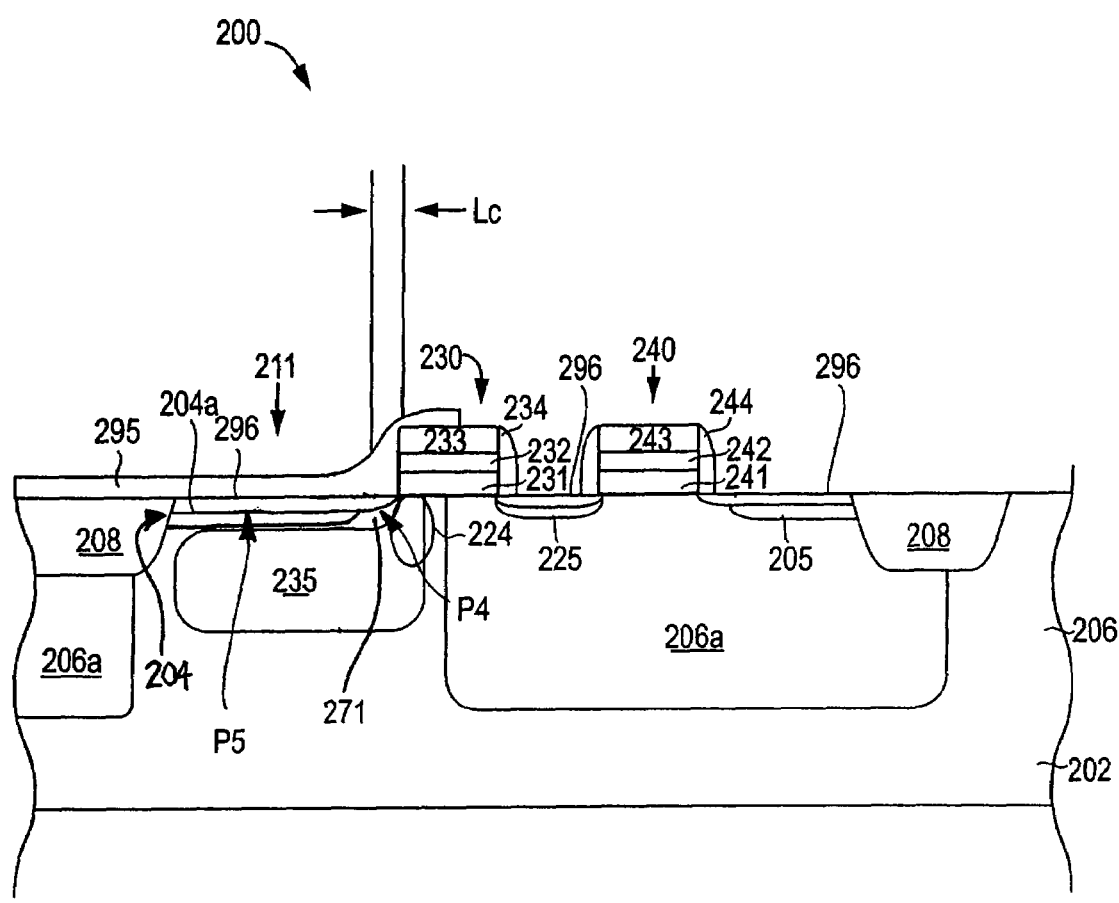
FIG. 6 is a cross-sectional view of a CMOS imager pixel cell illustrating a photodiode with a shallow doping profile formed in accordance with an exemplary embodiment of the invention.
Figure 8:
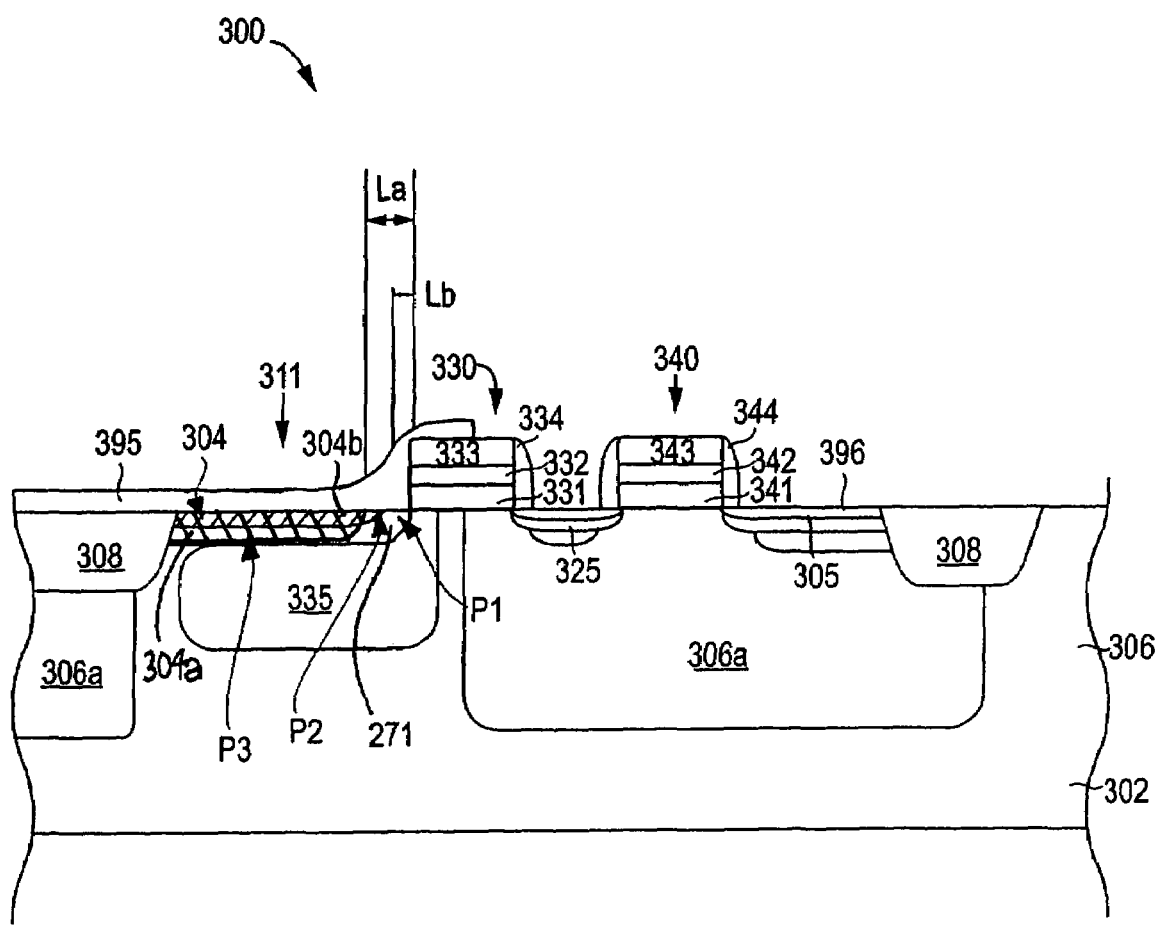
FIG. 8 is a cross-sectional view of a CMOS imager pixel cell illustrating a photodiode with a graded pinned surface layer having a shallow doping profile formed in accordance with an exemplary embodiment of the invention.

FIGS. 4, 6 and 8 illustrate three exemplary embodiments of an imager cell 100 (FIG. 4), 200 (FIG. 6) and 300 (FIG. 8) having respective pinned photodiodes 111, 211 and 311

Referring now to FIG. 4, a photodiode 111 constructed in accordance with one exemplary embodiment and method of the present invention is illustrated. The photodiode 111 comprises a graded pinned p-type surface layer 104 comprising three different regions or sub-regions: a first region 104a with a p+ dopant concentration, a second region 104b with a p-type dopant concentration, and a third region 171 having no photodiode p-type implantations.

The illustrated pixel cell 100 includes the p-n-p photodiode 111 structure formed by regions 104a, 104b, 171, 106 and 135. The p-type doped region 106 is formed in the areas of the substrate 102 as part of the p-type starting material. The p-type doped region 106 can be formed as p-wells 106a, if desired.

The n-type region 135 is formed by implanting dopant ions which for exemplary purposes is n-type. The n-type doped region 135 forms a photosensitive charge collection region for collecting photogenerated electrons. The n-type region 135 is advantageously angled towards the adjacent gate, here, the transfer transistor gate 130. The n-type region 135 may be formed by multiple implants using implant angles of from about 0 to about 30 degrees, and preferably of from about 0 to about 15 degrees.

The graded p-type surface layer 104 comprises a first region or sub-region 104a with a p+ dopant concentration, a second region or sub-region 104b with a p-type dopant concentration, and a third region or sub-region 171 having no p-type photodiode 111 dopant ions. The second region 104b has a lower dopant concentration than the first region 104a. The first region 104a is a p+ region that possesses a dopant gradient i.e., a gradient or graded profile. Specifically, the concentration of dopant ions is greater near the top surface of region 104a than the concentration found within substrate 102 for region 104a.

The third region 171 does not have photodiode p-type implantations. In the course of transistor processing, blanket p-type enhancement implants are typically used to set the transistor's Vt. Such a blanket p-type implant would be implanted across the entire photodiode 111. As a result, the lateral p-type gradient would still be maintained. Stated in another manner, the third region 171 is formed to have no photodiode p-type implantations or photodiode implantations; however, subsequent processes could implant dopant ions into region 171 if desired. In essence, the third region 171 is a separation region that separates the graded p-type surface layer's 104a and 104b from the n-type region 135 and edge of the transistor gate 130.

It should also be appreciated that the first region 104a is considered a p+ region since it has a greater p-type dopant ion concentration than region 104b. In the embodiment of FIG. 4, the p+ region 104a receives an implant. dose less than about $1.0 \times 10^{15}/cm^2$ and greater than about $1.0 \times 10^{12}/cm^2$.

The graded p-type pinned surface layer 104 is formed by conducting dual photodiode implantations i.e., two angled implants, with dopant ions which for exemplary purposes is p-type. The p-type pinned surface layer 104 is defined as a graded surface layer since it comprises three sub-regions 104a, 104b and 171. The three sub-regions have different dopant concentrations from each other.

The dopant concentration of the p-type pinned surface layer region 104a is preferably greater than the dopant concentration of the p-type pinned surface layer region 104b. Region 171 of pinned photodiode 111 has no p-type photodiode dopant ions i.e., no photodiode implantations have occurred in the region 171. The p-type pinned surface region 104a has preferably a deeper doping profile with respect to the top surface of the substrate 102, than the p-type pinned surface region 104b. In other words, p-type pinned surface region 104b is formed to be shallower than p-type region 104a with respect to the top surface of the substrate 102.

The p-type pinned surface region 104a is a doped p+ region and is formed with an angled implantation having an angle from about 2 to about 30 degrees. The p-type pinned surface region 104b is formed with a lower energy implant than what is used to form the p-type pinned surface region 104a, and is formed with an angled implantation having an angle from about 0 to about 15 degrees, and preferably from about 0 to about 10 degrees. The p-type pinned surface region 104b is formed after p-type pinned surface region 104a is formed. The p-type region 104a is formed such that it primarily sets the pinning voltage ($V_{pin}$) of the photodiode 111 to a desired level.

Region 104a is formed with an implant dose of from less than about $1.0 \times 10^{15}/cm^2$ and greater than about $1.0 \times 10^{12}/cm^2$, preferably from about $2.0 \times 10^{12}/cm^2$ to about $1.0 \times 10^{14}/cm^2$, and even more preferably with a dose concentration of from about $6.0 \times 10^{12}/cm^2$ to about $5.0 \times 10^{13}/cm^2$. Region 104b is preferably formed with an implant dose of from about $1.0 \times 10^{12}/cm^2$ to about $6.0 \times 10^{13}/cm^2$, and more preferably with an implant dose of from about $3.0 \times 10^{12}/cm^2$ to about $4.0 \times 10^{13}/cm^2$.

It should be appreciated that the lateral profile of the pinned surface regions 104a and 104b can be manipulated depending upon the desired characteristics of the pinned photodiode 111. Both implant regions 104a and 104b are self-aligned with respect to the adjacent gate edge, in this case, the transfer gate 130. Thus, both implants 104a and 104b may be angled and thereby offset by a distance $L_a$ and $L_b$, respectively, from the edge of the transfer gate 130.

For example, assuming that the total thickness of the gate stack 130 (which includes the gate oxide 131, the gate conductor 132, and if required, a gate insulator 133) is 2500 Å. If the p+ implant region 104a is implanted at an implant angle $\theta_a$ of 10 degrees, the resulting implant region 104a is offset from the edge of the transfer gate 130 by 2500 Å (gate stack height) multiplied by $\mathrm{Tan}\theta_a$, which equals 441 Å (2500 Å×$\mathrm{Tan}\theta_a$). The implant region 104a is said to be self-aligned to the edge of the transfer gate 130 but offset from the transfer gate 130 by a distance $L_a$ (441 Å) which is determined by the gate stack thickness and the implant angle $\theta_a$.

Similarly, implant region 104b could be implanted at an implant angle $\theta_b$ of 5 degrees, and the resulting implant region 104b could then be formed self-aligned to the edge of the transfer gate 130, but the offset for implant region 104b would now be 2500 Å×$\mathrm{Tan}\theta_b$, which is 219 Å. As a result, $\theta_a$ determines $L_a$, the transition from region 104a to region 104b and $\theta_b$ determines $L_b$, the distance between the edge of the transfer gate 130 and implant region 104b.

The presence of region 104b having a shallow doping profile with respect to the top surface of the substrate 102, allows the n-type region 135 to have a sharper profile since there is not a doped p+ region adjacent to the edge of the transfer gate 130. In addition, the p-type dopant ions comprising region 104b will not diffuse into or interact with the n-type region 135 with the presence of separation region 171. In essence, region 171 acts as a separation region to give the n-type region 135 a sharp profile.

As a result, FIG. 4 illustrates three defined photodiode surface regions or sub-regions: P1, P2 and P3. Region 1 (P1)

comprises region 171, which does not have any photodiode implants, so long as $\theta_a$ is greater than 0 degrees and $\theta_b$ is greater than 0 degrees. Region 2 (P2) comprises implant region 104b. Region 3 (P3) comprises both implant regions 104a and 104b. As a result, the dopant concentration in the P3 region is always greater than the P2 region, independent of the implant dose concentrations used when forming regions 104a and 104b. Further, since the P2 region has a smaller dopant concentration than the P3 region, the P2 region will also be shallower i.e., have a shallower doping profile, even if region 104a and 104b are implanted with the same implant energy. Still further, the P3 region has a graded profile. In other words, the top surface of the P3 region has a greater dopant concentration than the P3 region found deeper within the substrate 302.

FIG. 4 also illustrates a multi-layered transfer transistor gate 130 and reset transistor gate 140 formed over the substrate 102. For exemplary purposes, the substrate 102 is a silicon substrate. However, as noted above, the invention has equal utility with other semiconductor substrates.

The transfer transistor gate 130 comprises a gate oxide layer 131, a conductive layer 132, and an insulating layer 133. If desired, a silicide layer or a metal layer (not shown) may also be formed in the multi-layered gate stack 130, between the conductive layer 132 and the insulating layer 133. FIG. 4 illustrates an insulating sidewall spacer 134 formed on one side of the transfer transistor gate 130 with spacer insulator oxide layer 195.

The reset transistor gate 140 comprises a gate oxide layer 141, a conductive layer 142, and an insulating layer 143. If desired, a silicide layer or a metal layer (not shown) may be also formed in the multi-layered gate stack 140, between the conductive layer 142 and the insulating layer 143. The illustrated pixel 100 also includes insulating sidewall spacers 144 formed on both sides of the reset transistor gate 140.

The reset transistor gate 140 has an impurity doped source/drain 105 and shares an impurity doped common source/drain 125 with the transfer transistor gate 130. The impurity doped common source/drain 125 is typically known as a floating diffusion region. The multi-layered transfer gate 130 transfers charge accumulated in the charge collection region 135 of the photodiode 111 to the floating diffusion region 125.

Field oxide regions 108, often referred to as trench isolation regions, are formed in the substrate 102 separating adjacent pixel cells. In an exemplary embodiment, the trench isolation regions 108 are shallow trench isolation (STI) regions.

A method of forming the pixel cell 100 of FIG. 4 is now described with reference to FIGS. 5A–5H.

Figure 5A:
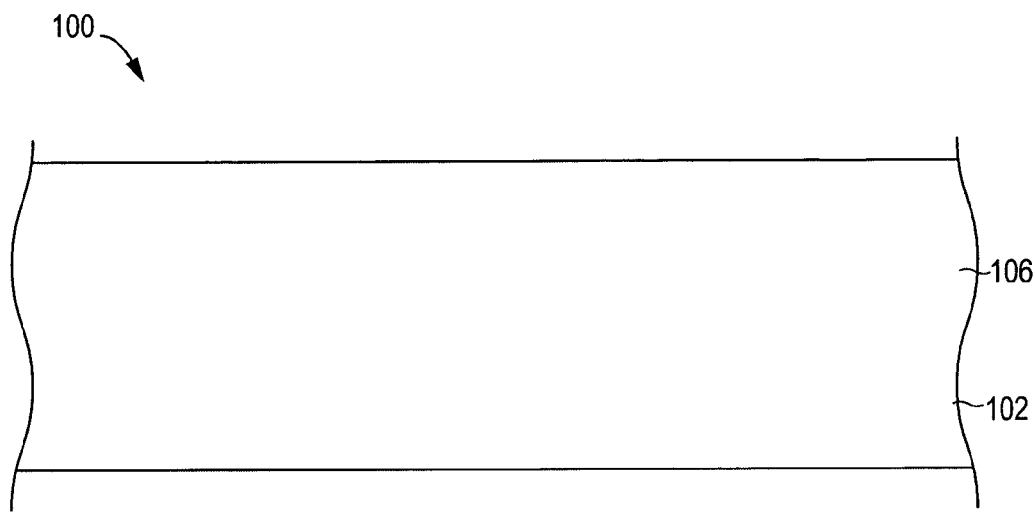
FIGS. 5A–5H are cross-sectional views of the CMOS imager pixel cell of FIG. 4 at various stages of formation in accordance with an exemplary embodiment of the invention.

FIG. 5A illustrates a substrate 102 along a diagrammatic side sectional view of a CMOS image structure formed in accordance with an embodiment of the invention. For exemplary purposes, the substrate 102 is a silicon substrate formed to a predetermined thickness. In the case shown, the substrate 102 is a p-type silicon substrate 102; but, it is also possible to use p-epi, p+, or n-type silicon substrates.

Figure 5B:
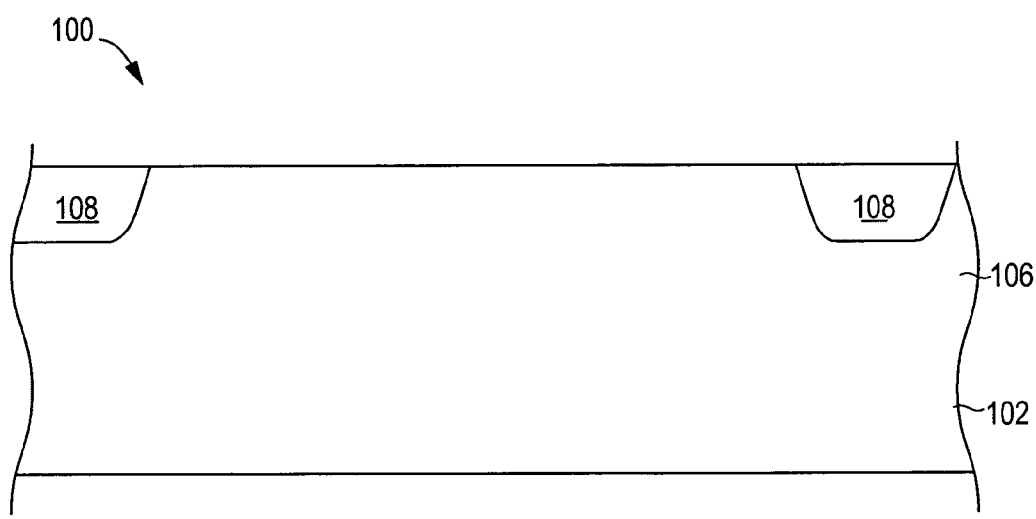

Referring now to FIG. 5B, trench isolation regions 108 are formed within the substrate 102 to separate the pixel cell 100 from adjacent pixel cells. The trench isolation regions 108 are filled with a dielectric material which may be an oxide material, for example, a silicon oxide such as SiO or $SiO_2$, a thermally grown oxide, oxynitride, a nitride material such as silicon nitride, silicon carbide, a high temperature polymer, or other suitable dielectric materials. The dielectric material may also be formed of any combination of oxide/ nitride, nitride/oxide and oxide/nitride/oxide materials.

In a preferred embodiment, the trench isolation regions 108 are shallow trench isolation regions and the dielectric material is a high density plasma (HDP) oxide, a material which has a high ability to effectively fill narrow trenches. Field oxide regions could also be formed through a LOCOS process or other techniques known in the art.

In addition, if desired, a thin insulating layer (not shown) may be formed on the sidewalls and bottoms of the STI regions 108 before filling the trenches with a dielectric material. The thin insulating layer may be formed of an oxide or of silicon nitride or an oxide/nitride combination, among others for example, to aid in smoothing out the corners in the bottom of the STI trench 108, and to reduce the amount of stress in the dielectric material used to later fill in the trenches 108.

Figure 5C:
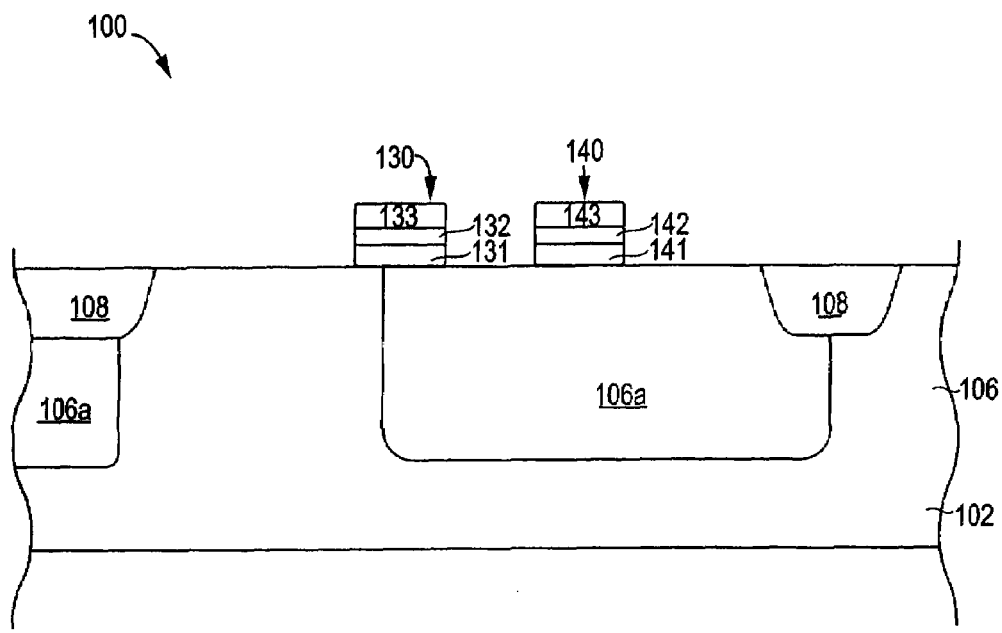

FIG. 5C illustrates a transfer transistor gate 130 and reset transistor gate 140 formed over the substrate 102. The transfer transistor gate 130 comprises a gate oxide layer 131 of grown or deposited silicon oxide on the substrate 102, a conductive layer 132 of doped polysilicon or other suitable conductor material, and, if desired, an insulating layer 133 which may be formed of, for example, silicon oxide (silicon dioxide), nitride (silicon nitride), oxynitride (silicon oxynitride), ON (oxide-nitride), NO (nitride-oxide), or ONO (oxide-nitride-oxide), among others. The reset transistor gate 140 is formed in an analogous fashion as the transfer transistor gate 130. For instance, the reset transistor gate stack 140 could comprise a gate oxide layer 141, a conductive layer 142, and, if desired, an insulating layer 143.

The gate oxide layers 131, 141, insulating layers 133, 143, and the conductive layer 132, 142 may be formed by conventional deposition methods, for example, chemical vapor deposition (CVD) or plasma enhanced chemical vapor deposition (PECVD), among others. In a preferred embodiment, the gate oxide layers 131, 141 are grown oxides.

If desired, a silicide layer or metal layer (not shown) may also be formed in the transfer transistor gate 130 or reset transistor gate 140, between the conductive layers 132, 142 and the insulating layers 133, 143. Advantageously, the gate structures of all other transistors (not illustrated) in the imager circuit design may have this additionally formed silicide layer or metal layer. This silicide layer may be titanium silicide, tungsten silicide, cobalt silicide, molybdenum silicide, or tantalum silicide, among others. The metal layer could also be a barrier layer/refractory metal such as TiN/W or $WN_x$/W, or it could be entirely formed of $WN_x$, among others.

In a similar manner, additional transistors can be provided such as source follower transistors (not shown) and row select transistors (not shown) as described above in forming the transfer transistor gate 130 and reset transistor gate 140. At this point, masked p-well implant regions 106a can be formed within the substrate 102, if desired. P-well regions 106a could be formed before or after gate stack formation.

Figure 5D:
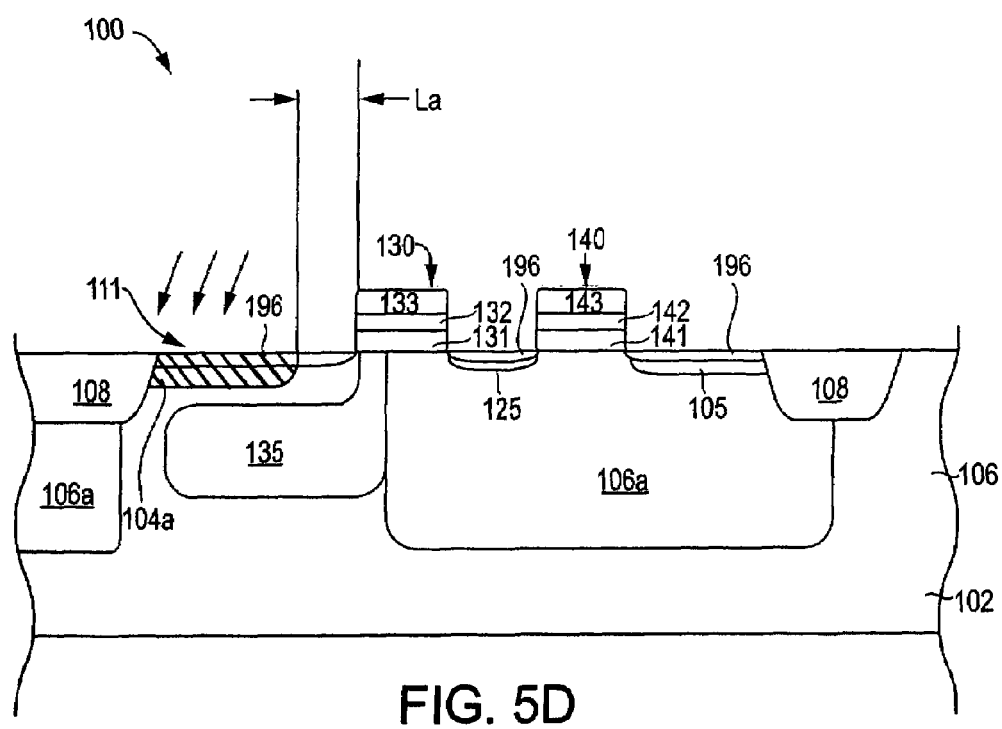

Next, FIG. 5D illustrates a source/drain oxide layer 196 formed as a result of a source/drain oxidation process. The source/drain oxidation process is typically conducted to improve the gate oxide layers 131 and 141 characteristics. Typically, the gate oxide layers 131 and 141 are grown to a thickness that ranges from about 20 Å to about 500 Å, preferably from about 30 Å to about 100 Å, and more preferably about 62 Å thick. After the transistor gates 130 and 140 are etched, the gate oxide layer 131, 141 becomes thinner and damaged as a result of the gate stack etch. The following source/drain oxidation creates a damage repaired oxide layer 196, which prevents channeling, and protects the substrate's 102 top surface from process contamination. FIG. 5D also illustrates n-type LDD implant regions 125 and 105.

It should be appreciated that while the source/drain oxide layer 196 has several advantages including improving gate oxide reliability, it is not a required step for the present invention. If the source/drain oxide layer is either not done or later removed, the subsequent implant energies used to form regions 104a, 104b, and 135 can be decreased since the regions 104a, 104b and 135 would be formed without implanting through an oxide layer 196.

Figure 5E:
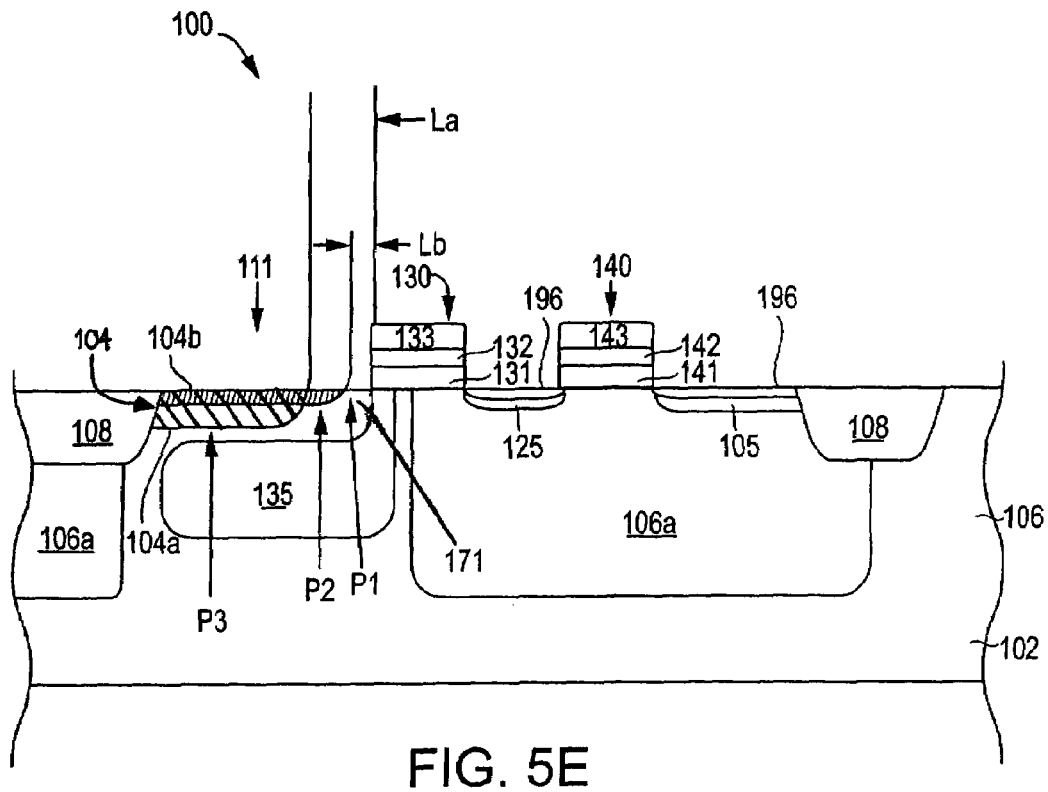
Figure 5F:
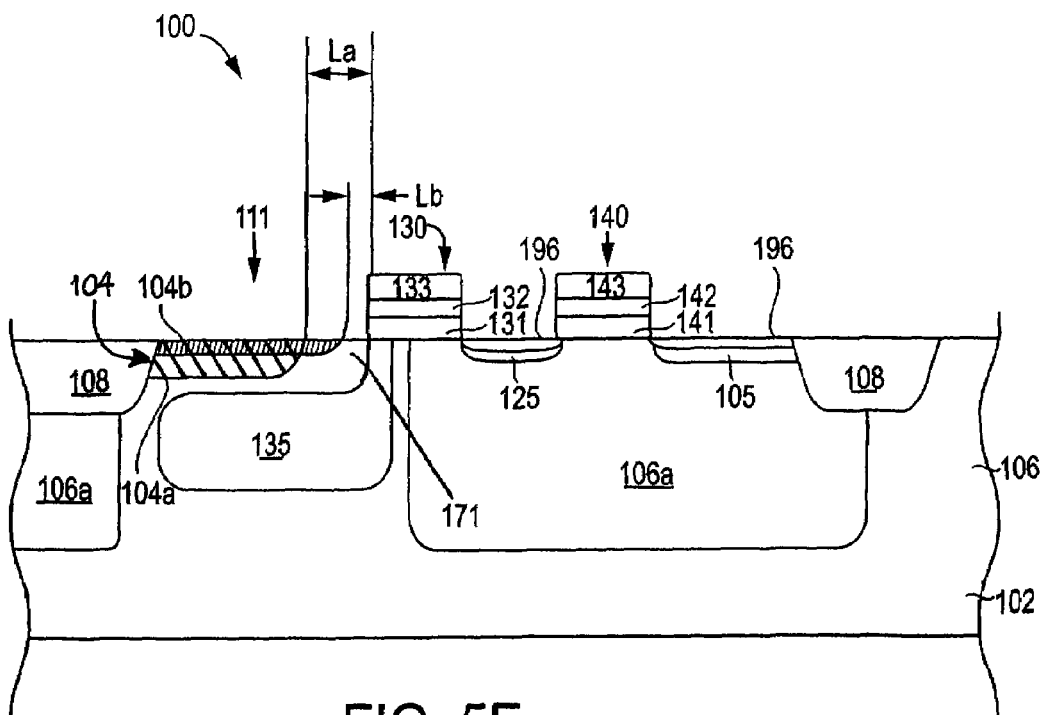

Referring to FIGS. 5D and 5E, a p-n-p pinned photodiode 111 is formed by regions 104a, 104b, 171, 135 and 106. All of these regions are formed to a predetermined dopant concentration except for region 171 which is formed with no photodiode implantations. For example, region 104a is formed to have a p+ dopant concentration. Region 104b is formed to have a p-type dopant concentration which is less than the p+ dopant concentration in region 104a. Region 135 is formed to have an n-type dopant concentration.

In contrast, the third region 171 has no photodiode implantations. In the course of transistor processing, blanket p-type enhancement implants are typically used to set the transistor's $V_t$. Such a blanket p-type implant would be implanted across the entire photodiode 111. As a result, the lateral p-type gradient would still be maintained. Stated in another manner, the third region 171 is formed to have no photodiode p-type implantations or photodiode implantations; however, subsequent processes could implant dopant ions into region 171 if desired. In essence, the third region 171 is a separation region that separates the graded p-type surface layer's 104a and 104b from the n-type region 135 and edge of the transistor gate 130.

In the present invention, it should be appreciated that the implant energies of the dopant ions depends on the implant type. For instance, for the same implant depth, $BF_2$'s implant energy is greater than the implant energy for $B^{11}$. Thus, for p-type implants, $BF_2$ is preferred as one can achieve the same shallow depth as $B^{11}$ with an easier to control and higher $BF_2$ implant energy. For instance, p-type regions 104a and 104b, if implanted with $BF_2$, can be implanted with an implant energy of from about 1 to about 40 keV, and preferably from about 3 to about 20 keV.

Referring still to FIG. 5D, a p-type doped region 106 i.e., epitaxial region ("p-epi"), is part of the substrate 102 starting material. Typically, the p-type doping of the p-epi is chosen to be appropriate for the image sensor. However, the p-type doped regions 106 could be formed by high energy ion implantation and diffusion. If desired, p-wells 106a can be formed within the substrate 102. As described above, the p-well regions 106a may be formed before or after the formation of trench isolation regions 108. For instance, the p-well regions 106a could be formed after the formation of trench isolation region 108, such as after formation of the transfer and reset transistor gates 130 and 140. P-type dopant ions such as boron or indium, among others, may be used in forming any of the p-type regions within pixel cell 100.

The n-type region 135 is formed by implanting dopants which for exemplary purposes is n-type. N-type dopant ions such as arsenic, antimony, or phosphorus, may be employed to form n-type regions within pixel cell 100. FIG. 5D illustrates the n-type region 135 advantageously angled towards the adjacent gate, here, the transfer transistor gate 130. The n-type region 135 may be formed by multiple implants using implant angles of from about 0 to about 30 degrees, and preferably of from about 0 to about 15 degrees.

The graded pinned surface layer 104 (FIG. 4) comprising regions 104a, 104b are formed by conducting a first and second photodiode implantation, e.g., dual angled dopant implantations, with dopant ions which for exemplary purposes are p-type, such that p-type ions are implanted over the n-type region 135. It should be appreciated that the p-type pinned surface layers 104a and 104b can be formed by methods other than ion implantation as is known in the art. For example, regions 104a and 104b may be formed by a gas source plasma doping process, or by diffusing p-type dopants into the substrate 102 from an in-situ doped layer, or a doped oxide layer deposited over the area where photodiode 111 is to be formed. It should be appreciated that the order of the p-type and n-type implantations in forming photodiode 111 is not important.

It should also be appreciated that photodiode 111 is formed by selective implantation i.e., the region where the photodiode is to be formed is the only area of the substrate that is subject to photodiode implantations. Other regions of the pixel cell 100 are protected from the photodiode implantations by methods well-known in the art. For instance, a resist or mask (not illustrated) and an opening in the resist or mask can be provided such that only the region that will become photodiode 111 is subject to photodiode implantation.

The dopant concentration of the p-type pinned surface layer region 104a is preferably greater than the dopant concentration of the p-type pinned surface layer region 104b, such that region 104a is formed as a doped p+ surface region 104a. The doped p+ pinned surface region 104a preferably has a deeper doping profile with respect to the top surface of the substrate 102, than the p-type pinned surface region 104b. In essence, the formation of the doped p+ region 104a is carried out with a higher energy than the implant energy used to form p-type region 104b. Stated in another manner, p-type pinned surface region 104b is formed to be shallower than p-type region 104a with respect to the top surface of substrate 102.

The p+ pinned surface region 104a is formed first with an implantation having an angle of from about 2 to about 30 degrees, and is preferably of from about 2 to about 15 degrees. This first angled implantation is preferably angled away from the edge of the transistor gate 130. The implant angle used to form region 104a is defined as $\theta_a$. As a result of the angled implant, region 104a is self-aligned to the adjacent gate edge, here the edge of transfer gate 130, but is spaced away from the transfer gate 130 by a distance $L_a$, which is equal to the gate stack height multiplied by $\tan\theta_a$ (transfer gate stack height×$\tan\theta_a$). For instance, if the gate stack height of transfer gate 130 is 2500 Å and $\theta_a$ is 10 degrees, then $L_a$ is 441 Å. In other words, implant region 104a is offset from the transfer gate 130 by 441 Å.

The doped p+ surface region 104a is formed such that it primarily sets the pinning voltage ($V_{pin}$) of the photodiode 111 to the desired voltage. Region 104a is formed with an implant dose of from less than about $1.0\times10^{15}/cm^2$ and greater than about $1.0\times10^{12}/cm^2$, preferably from about $2.0\times10^{12}/cm^2$ to about $1.0\times10^{14}/cm^2$, and even more preferably with a dose concentration of from about $6.0\times10^{12}/cm^2$ to about $5.0\times10^{13}/cm^2$. It should be appreciated that a surface region near the transfer gate 130 is not implanted at this stage in processing and is therefore unpinned. The implant angle $\theta_a$, used to form region 104a, will set the lateral location where the p-type implant gradient transitions from implant region 104a to region 104b.

Referring now to FIG. 5E, a p-type surface region 104b is formed after forming the doped p+ surface region 104a. The p-type pinned surface region 104b is preferably formed with a lower energy angled implant than what is used to form the p+ region 104a. Region 104b is formed with an implantation having an angle of from about 0 to about 15 degrees, and preferably of from about 0 to about 10 degrees. If an angled implant is used to form region 104b, it should be angled away from the edge of the transistor gate 130.

It should be appreciated that portions of region 104a is further doped with the dopant ions used to form region 104b. As a result, the top surface of region 104a has a higher dopant concentration than the 104a region found deeper within substrate 102.

The implant angle used to form region 104b is defined as $\theta_b$. As a result of the angled implant, region 104b is self-aligned to the adjacent gate edge, here the edge of transfer gate 130, but is spaced away by a distance $L_b$ which is equal to the gate stack height multiplied by $\mathrm{Tan}\theta_b$ (transfer gate stack height×$\mathrm{Tan}\theta_b$). For instance, if the gate stack height of transfer gate 130 is 2500 Å and $\theta_b$ is 5 degrees, then $L_b$ is 219 Å. In other words, implant region 104b is offset from the transfer gate 130 by 219 Å. For purposes of simplification, region 104b is referred to as merely a p-type region 104b and region 104a is referred to as a p+ region 104a.

A lower energy can also be used for this second implant 104b to control the depth of the second implant region 104b. For instance, a low energy implant keeps the p-type region's 104b doping profile much shallower with respect to the top surface of the substrate 102 than p-type region's 104a doping profile. The p-type region 104b is preferably formed with an implant dose of from about $1.0 \times 10^{12}/\mathrm{cm}^2$ to about $6.0 \times 10^{13}/\mathrm{cm}^2$, and preferably with an implant dose of from about $3.0 \times 10^{12}/\mathrm{cm}^2$ to about $4.0 \times 10^{13}/\mathrm{cm}^2$.

It should be appreciated that in FIG. 5E, three photodiode surface regions are defined: P1, P2 and P3. Region 1 (P1), does not have any p-type photodiode implants, so long as $\theta_a$ is greater than 0 degrees and $\theta_b$ is greater than 0 degrees. Region 1 acts as a separation region. In such a case where $\theta_a$ is greater than 0 degrees and $\theta_b$ is greater than 0 degrees, region 1's width is determined by $L_b$. For instance, if $L_b$ is 219 Å, then P1 is 219 Å wide. Region 2 (P2) comprises implant region 104b. Region 3 (P3) comprises implant regions 104a and 104b.

As a result, the dopant concentration in the P3 region will always be greater than the dopant concentration in the P2 region, independent of the implant doses used when forming regions 104a and 104b. Further, since the P2 region has a lower dopant concentration than the P3 region, the P2 region will also be shallower (i.e., have a shallower doping profile) even if region 104a and 104b are implanted with the same implant energy. Still further, the P3 region has a gradient profile. For instance, the top surface of the P3 region has a greater dopant concentration than the P3 region found deeper within the substrate.

It should be appreciated that p-type angled implants, such as the first and second implants used to form regions 104a and 104b, can be conducted before or after the n-type region 135 is formed. In addition, the first and second implants used to form regions 104a and 104b can be done before or after spacer insulator oxide layer 195 deposition, which forms sidewall spacers on the sides of gate stacks 130 and 140; it is just preferable that these implants be conducted before the spacer oxide deposition.

If the implants used to form regions 104a and 104b are conducted after the spacer oxide layer 195 deposition, the implants can still be conducted as angled implants and will still result in regions 104a and 104b that are self-aligned to the edge of the transfer gate 130. In this case, the implants will receive an additional lateral displacement from the edge of the transfer gate 130 as a result of the sidewall spacer thickness. In addition, the implant energies will need to be increased to compensate for the implants getting through the spacer oxide layer's 195 thickness. As a result, all photodiode implants are preferably conducted after the gate stacks are formed and before spacer oxide layer deposition.

In another embodiment, the second 104b implant is completely eliminated (not illustrated), if desired. However, a graded p-type surface implant region 104 would still be present due to region 104a being formed by angled implantation $\theta_a$. In this alternative embodiment, the surface p-type region 104 would consist of P1 i.e., region 171 and P3 i.e., region 104a. Region P3 would still comprise a p+ concentration and region P1 would not have any p-type photodiode implants.

Figure 5G:
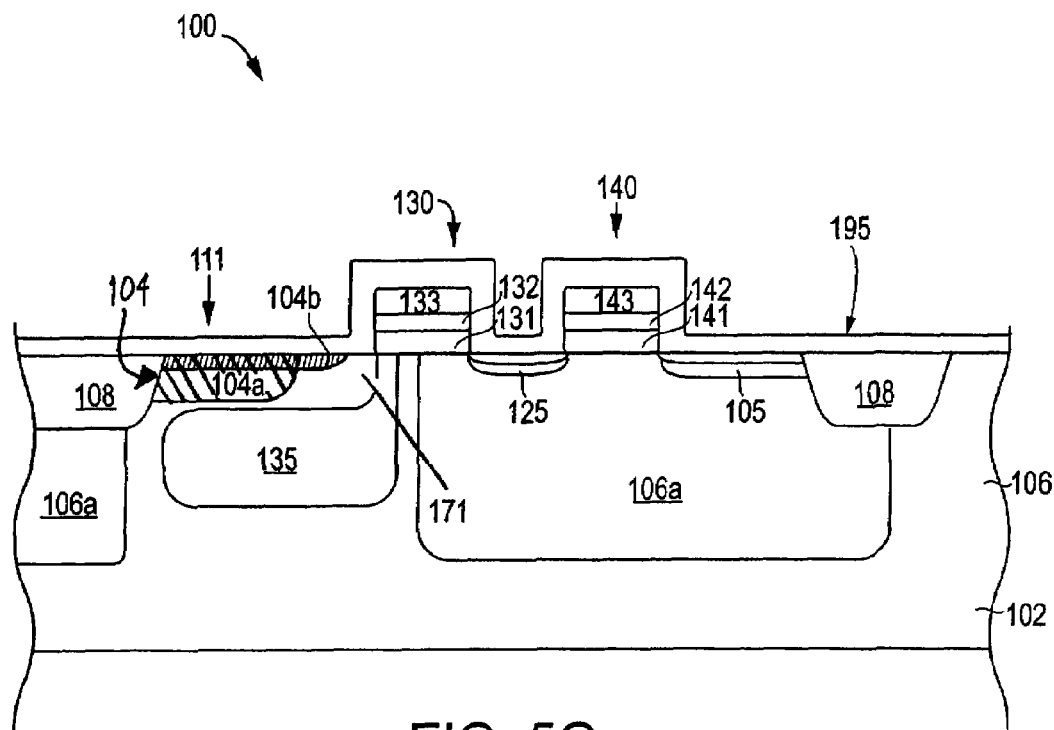
Figure 5H:
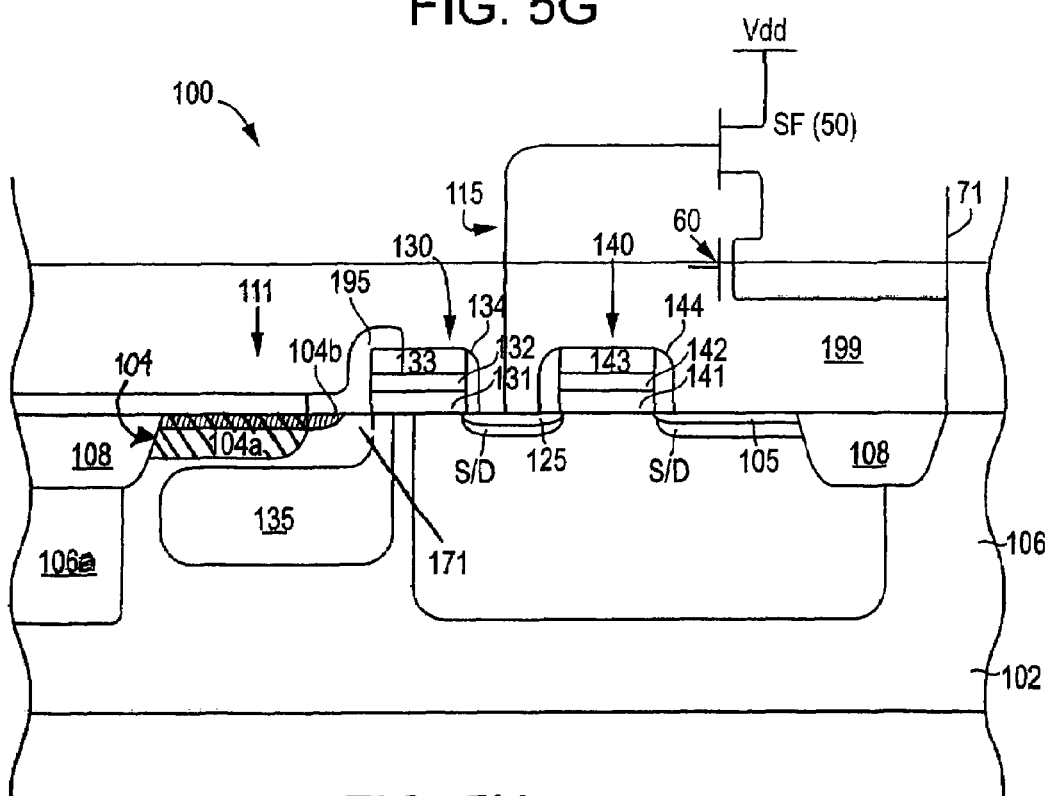

Referring now to FIG. 5G, a spacer insulator oxide layer 195 is deposited over the substrate 102. Then, insulating sidewall spacers 134 and 144 are formed on the sides of the gate stack 130 and 140 through conventional methods as illustrated in FIG. 5H. The sidewall spacers 134 and 144 may be formed, for example, of silicon dioxide, silicon nitride, silicon oxynitride, ON, NO, ONO or TEOS, among others. As mentioned previously, the graded p-type surface regions 104a and 104b can be formed after depositing the oxide layer 195, if desired.

Next, after the sidewall spacers 134 and 144 are formed, impurity doped source/drain regions can be formed. FIG. 5H illustrates forming impurity doped source/drain regions 125 and 105 for the transfer transistor gate 130 and reset transistor gate 140 using a masked spacer etch that masks the spacer etch from the photodiode region 111.

It should be appreciated that the impurity doped source/drain region 105 can have a different dopant concentration from the commonly shared impurity doped floating diffusion region 125 of the transfer transistor gate 130. In this manner, the transfer transistor gate 130 transfers charge accumulated in the charge collection region 135 of the pinned photodiode 111 to the floating diffusion region 125. The impurity doped source/drain regions 125 and 105 can be formed by conventional methods known in the art.

It should also be appreciated that if desired, the pinned photodiode 111 can be formed after the spacer etch rather than after gate stack formation (FIG. 5C). In this alternative embodiment, after the spacer etch, a bare silicon substrate 102 (not illustrated) would result. The subsequent implant energies used to form the photodiode 111 could then be accordingly decreased, if desired, since the regions are being formed without implanting through an oxide layer.

The CMOS pixel cell 100 is then processed to produce an operative pixel by conventional processing methods that form insulating, shielding, and metallization layers to connect gate lines and other connections to the pixel sensor cells. For instance, as FIG. 5H illustrates, a transparent insulating layer or passivation layer 199, for example, silicon dioxide, BSG, PSG, or BPSG, can be provided over the entire surface which is CMP planarized and etched to provide an opening and a metal conductor 115 can be used to connect the floating diffusion region 125 with a source follower transistor 50 and row select transistor 60. Additional layers of conductors and insulators may also be used to interconnect the structures and to connect the pixel cell 100 to peripheral circuitry.

As a result, the method and structure illustrated in FIGS. 4–5H provide greater control of the implant doping profile of the photodiode 111 near the edge of the transfer gate 130 while giving good reproducibility of the pinning voltage $V_{pin}$. The photodiode's 111 capacitance is increased due to the shallow implants. For instance, in a preferred embodiment, the angled implantations used to form photodiode 111 are conducted prior to spacer oxide 195 deposition. This allows for separate optimization of the photodiode 111 for image performance and the transistor spacer process for transistor performance.

Moreover, placing the higher dose implant that forms the p+ type region 104a farther away from the edge of the transfer gate 130, improves the ability of the n-type region 135 implant to transfer collected charge to the transfer gate 130 by reducing the compensation of the n-type implant by the p+ implant. The second angled implant that forms p-type region 104b, in effect, creates a more n-type region next to the edge of the transfer gate 130 and eliminates the barrier normally associated with conventionally formed photodiodes.

Accordingly, the result is a pixel cell 100 with a graded p-type surface layer 104 and pinned photodiode 111 adjacent the transfer gate 130 that has improved barrier, image lag, transfer gate leakage, and photodiode dark current performance. It should be appreciated that p-type surface layer 104 is defined as a graded surface layer since it has regions or sub-regions of varying dopant concentrations. For instance, region 104a i.e., sub-region 104a has a higher dopant concentration than region 104b i.e., sub-region 104b. In contrast, region 171 i.e., sub-region 171 does not have any photodiode p-type implantations.

It should also be appreciated that the structure and methods of FIGS. 4–5H can be used with equal effectiveness to CCD Imagers and other CMOS imagers where the gate adjacent to the photodiode may not be a transfer gate, but instead, a global shutter, storage gate, or high-to-dynamic range gate.

Referring now to FIG. 6, a pixel cell 200 constructed in accordance with an exemplary embodiment and method of the present invention is shown having a photodiode 211 with a shallow doping profile with respect to the top surface of the substrate 202.

The illustrated pixel cell 200 includes the p-n-p photodiode 211 structure formed by regions 204a, 271, 206 and 235. The p-type doped region 206 is formed in an area of the substrate 202 as part of the p-type starting material. The p-typed doped region 206 can be formed as p-wells 206a, if desired. The n-type doped region 235 is formed by implanting dopant ions which for exemplary purposes is n-type.

The n-type doped region 235 forms a photosensitive charge collection region for collecting photo-generated electrons. The n-type region 235 is advantageously angled towards the adjacent gate, here, the transfer transistor gate 230. The n-type region 235 may be formed by multiple implants using implant angles of from about 0 to about 30 degrees, and preferably of from about 0 to about 15 degrees. The n-type doped region 235 is preferably formed from arsenic (As) or antimony (Sb) dopant ions rather than phosphorus. In essence, n-type dopant ions with low diffusivity are used. As a result, the n-type doped region 235 has a shallow doping profile with respect to the top surface of the substrate 202. Further, the n-type region 235 is formed such that it is shallow and self-aligned with respect to an adjacent gate.

The graded pinned surface layer 204 is formed by regions or sub-regions 204a and 271. It should be appreciated that p-type surface layer 204 is defined as a graded surface layer since it has regions or sub-regions of varying dopant concentrations. For instance, region 204a i.e., sub-region 204a has a higher dopant concentration than region 271 i.e., sub-region 271, which does not have any photodiode p-type implantations.

Region 204a is formed by an angled implantation with dopant ions which for exemplary purposes is p-type. The p-type pinned surface region 204a is preferably laterally offset by a distance $L_c$ from the transfer transistor gate 230 by the angled implantation. The p-type pinned surface region 204a is a doped p+ region. The p-type pinned surface region 204 has a shallow doping profile with respect to the top surface of the substrate 202. The p-type pinned surface region 204 also comprises region 271. Region 271 does not have photodiode implantations i.e., no photodiode p-type implantations. As a result, region 204a always has a greater dopant concentration than region 271 of pinned surface region 204.

The p-type pinned surface region 204a is a doped p+ region and is formed with an angled implantation having an angle from about 2 to about 30 degrees. Region 204a is formed with an implant dose of from less than about $1.0 \times 10^{15}/cm^2$ and greater than about $1.0 \times 10^{12}/cm^2$, preferably from about $2.0 \times 10^{12}/cm^2$ to about $1.0 \times 10^{14}/cm^2$, and even more preferably with a dose concentration of from about $6.0 \times 10^{12}/cm^2$ to about $5.0 \times 10^{13}/cm^2$.

Figure 1:
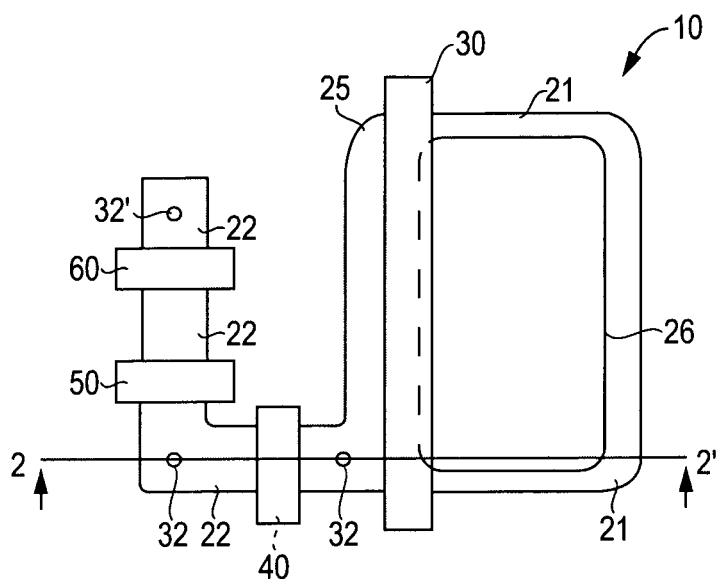
FIG. 1 is a top plan view of an exemplary CMOS imager pixel cell.
Figure 2:
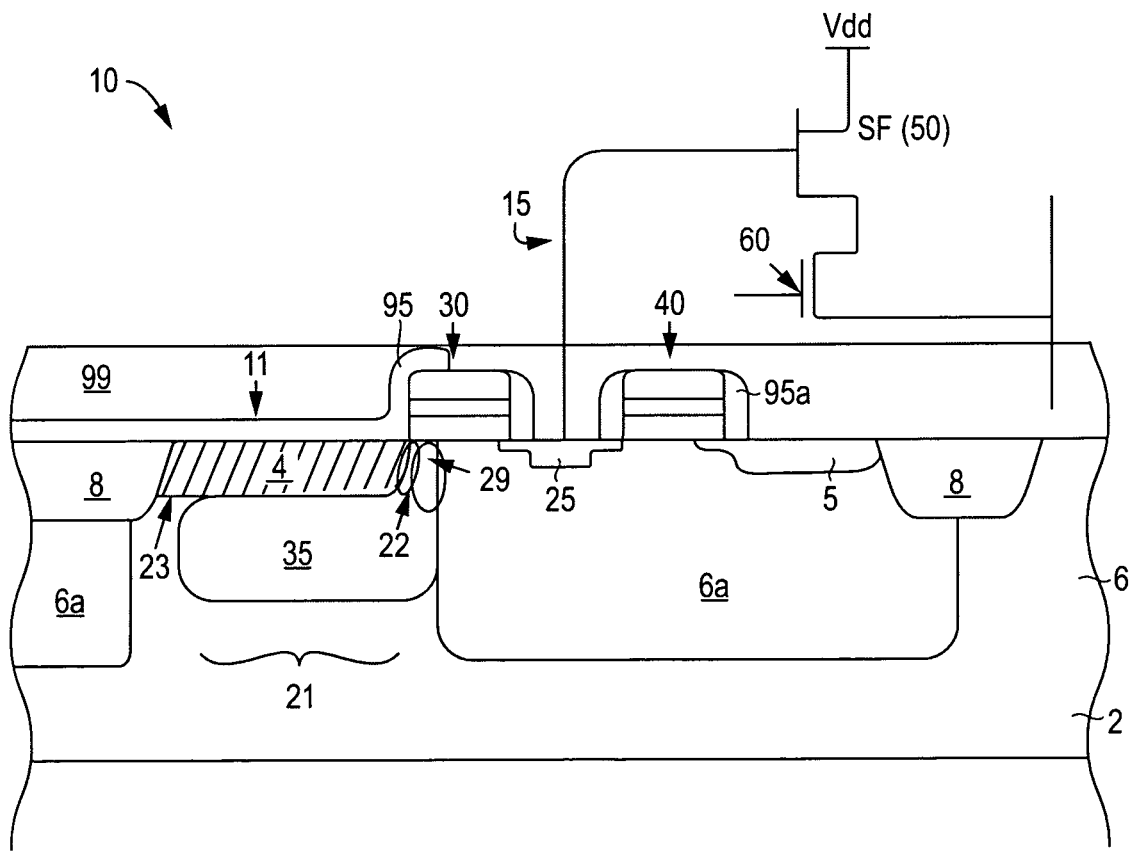
FIG. 2 is a cross-sectional view of the CMOS imager pixel cell of FIG. 1 taken along line 2–2'.
Figure 3:
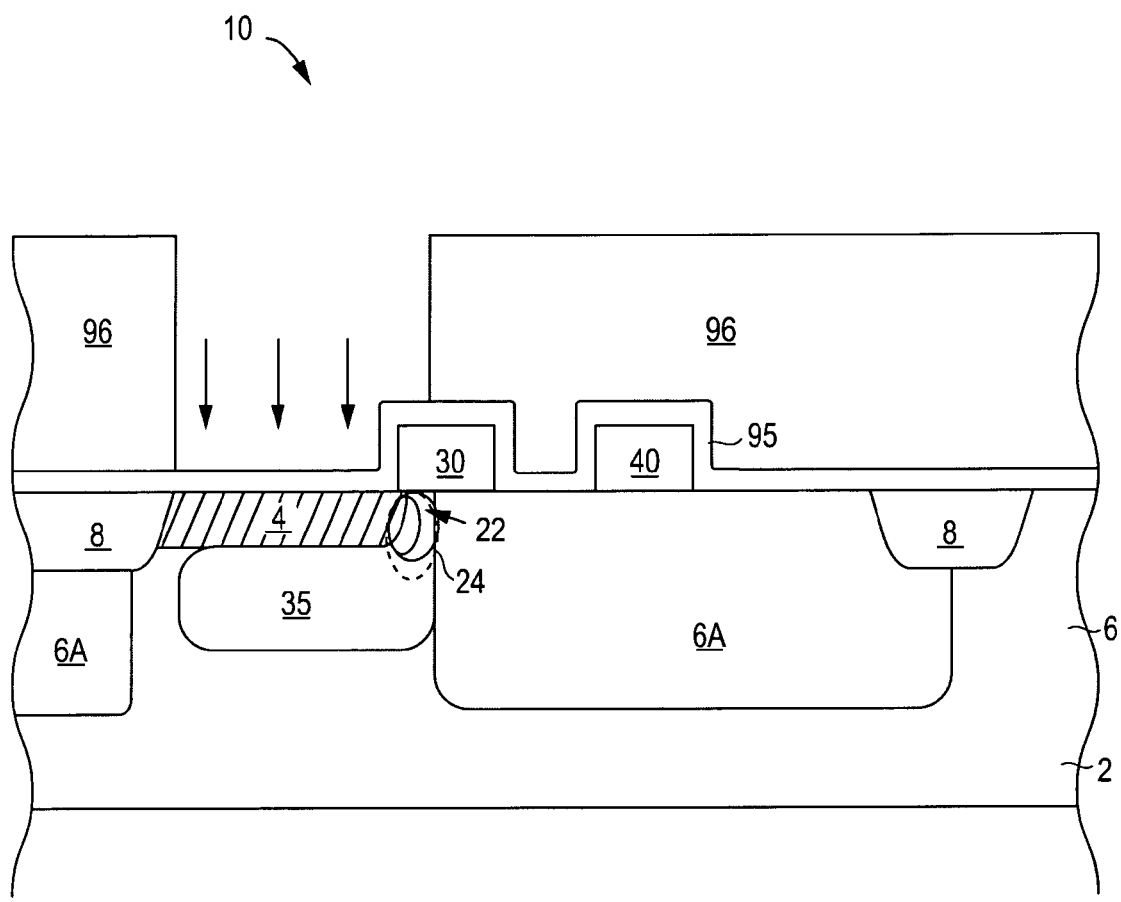
FIG. 3 illustrates an exemplary CMOS imager pixel cell with a conventionally formed photodiode.

It should be appreciated that in a conventionally formed photodiode 11 as illustrated in FIGS. 2 and 3, the p+ type region 4 is formed with an implant dose of at least $1.0 \times 10^{15}/cm^2$, and the p-type regions are formed with an implant dose of from $1.0 \times 10^{11}$ to $1.0 \times 10^{12}/cm^2$. In the present invention, the p+ region 204a is formed to be less than about $1.0 \times 10^{15}/cm^2$ and greater than about $1.0 \times 10^{12}/cm^2$.

It should further be appreciated that the lateral profile of the pinned surface region 204a can be manipulated depending upon the desired characteristics of the pinned photodiode 211. Implant region 204a is formed self-aligned with respect to the adjacent gate edge, in this case, the transfer gate 230. In other words, the implant forming region 204a can be angled and thereby offset by a distance $L_c$, respectively, from the edge of the transfer gate 230.

For example, assuming that the total thickness of the transfer gate stack 230 (which includes the gate oxide 231, the gate conductor 232, and if required, a gate insulator 233) is 2500 Å. If the p+ implant region 204a is implanted at an implant angle $\theta_c$ of 10 degrees, the resulting implant region 204a is offset from the edge of the transfer gate 230 by 2500 Å (gate stack height) multiplied by $\text{Tan}\theta_c$, which equals 441 Å (2500 Å×$\text{Tan}\theta_c$). The implant region 204a is said to be self-aligned to the edge of the transfer gate 230 but offset from the transfer gate 230 by a distance $L_c$ (441 Å) that is determined by the gate stack thickness and the implant angle $\theta_c$. As a result, $\theta_c$ determines $L_c$, the distance between the edge of the transfer gate 230 and implant region 204a.

The presence of regions 204a, 271 and 235 having a shallow doping profile with respect to the top surface of the substrate 202, allows the photodiode 211 to have a sharper profile since there is not a doped p+ region adjacent to the edge of the transfer gate 230. Region 271 is between the edge of the transfer gate 230 and the doped p+ region 204a.

In addition, there is less chance for punch-through currents due to region 235 since this region 235 is formed to a shallower depth than conventionally formed charge collection regions 35 as illustrated in FIGS. 2 and 3. Specifically, the region 235 is formed with a shallow, low-energy angled implant employing a low diffusivity n-type dopant ion. As a result, region 235 does not have a long neck 24 (FIGS. 2 and 3) that is typically associated with a conventionally formed n-type region 35 (FIGS. 2 and 3). Thus, there is less chance for the p-type dopant ions comprising region 204a to diffuse into and interact with the n-type region 235.

As a result, FIG. 6 illustrates two defined photodiode surface regions or sub-regions: P4 and P5. Region 4 (P4) does not have any photodiode implant ions at all, so long as $\theta_c$ is greater than 0 degrees. Region 5 (P5) comprises implant region 204a. As a result, the dopant concentration in the P5 region is always greater than the P4 region, independent of any implant dose concentration or implant energy.

As a result, region 271 does not have photodiode 211 p-type implantations. In the course of transistor processing, blanket p-type enhancement implants are typically used to set the transistor's $V_t$. Such a blanket p-type implant would be implanted across the entire photodiode 211. As a result, the lateral p-type gradient would still be maintained. Stated in another manner, the P4 region 271 is formed to have no photodiode p-type implantations or photodiode implantations; however, subsequent processes could implant dopant ions into region 271 if desired. In essence, the P4 region 271 is a separation region that separates the p-type surface layer 204a from the n-type region 235 and edge of the transistor gate 230.

FIG. 6 also illustrates a multi-layered transfer transistor gate 230 and reset transistor gate 240 formed over the substrate 202. For exemplary purposes, the substrate 202 is a silicon substrate. However, as noted above, the invention has equal utility with other semiconductor substrates.

The transfer transistor gate 230 comprises a gate oxide layer 231, a conductive layer 232, and an insulating layer 233. If desired, a silicide layer or metal layer (not shown) may also be formed in the multi-layered gate stack 230, between the conductive layer 232 and the insulating layer 233. FIG. 6 illustrates an insulating sidewall spacer 234 formed on one side of the transfer transistor gate 230 with spacer insulator oxide layer 295.

The reset transistor gate 240 comprises a gate oxide layer 241, a conductive layer 242, and an insulating layer 243. If desired, a silicide layer or metal layer (not shown) may also be formed in the multi-layered gate stack 240, between the conductive layer 242 and the insulating layer 243. FIG. 6 illustrates insulating sidewall spacers 244 formed on both sides of the reset transistor gate 240.

The reset transistor gate 140 has an impurity doped source/drain region 205 and shares an impurity doped common source/drain region 225 with the transfer transistor gate 230. The impurity doped common source/drain 225 is typically known as a floating diffusion region. The multi-layered transfer gate 230 transfers charge accumulated in the charge collection region 235 of the photodiode 211 to the floating diffusion region 225.

Field oxide regions 208, often referred to as trench isolation regions, are formed in the substrate 202 separating adjacent pixel cells. In an exemplary embodiment, the trench isolation regions 208 are STI regions.

A method of forming the pixel cell 200 of FIG. 6 is now described with reference to FIGS. 7A–7H.

Figure 7A:
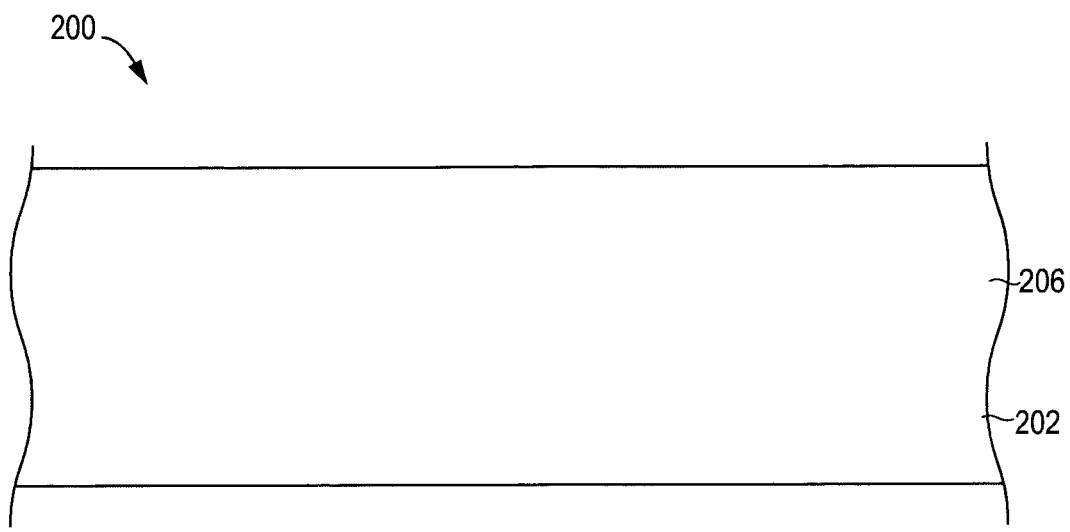
FIG. 7A–7H are cross-sectional views of the CMOS imager pixel cell fragment of FIG. 6 at various stages of formation in accordance with an exemplary embodiment of the invention.

FIG. 7A illustrates the substrate 202 along a diagrammatic side sectional view of a CMOS image structure formed in accordance with an embodiment of the invention. For exemplary purposes, the substrate 202 is a silicon substrate formed to a predetermined thickness. In the case shown, the substrate 202 is a p-type silicon substrate 202; but, it is also possible to use p-epi, p+, or n-type silicon substrates.

Figure 7B:
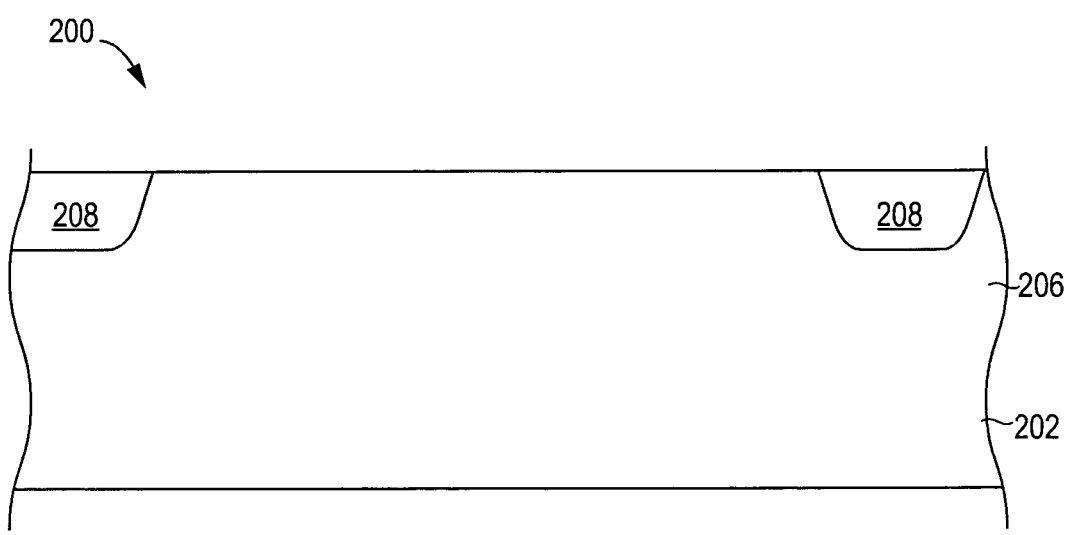

Referring now to FIG. 7B, trench isolation regions 208 are formed within the substrate 202 to separate the pixel cell 200 from adjacent pixel cells. The trench isolation regions 208 are formed in an analogous manner as described with reference to FIG. 5B. In a preferred embodiment, the trench isolation regions 208 are STI regions and the dielectric material is a high density plasma (HDP) oxide, a material which has a high ability to effectively fill narrow trenches. Field oxide regions could also be formed using a LOCOS process.

Figure 7C:
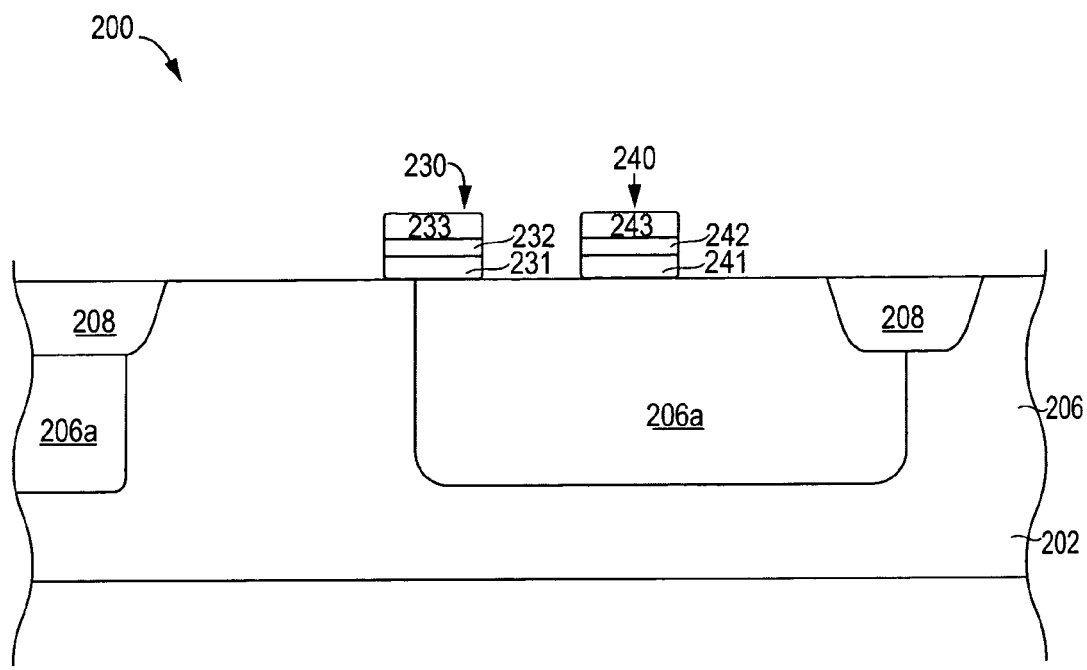

FIG. 7C illustrates a transfer transistor gate 230 and reset transistor gate 240 formed over the substrate 202. The transfer transistor gate 230 and reset transistor gate 240 can be formed in a similar manner as described with reference to FIG. 5C in forming transfer gate 130 and reset gate 240. Further, additional transistors can be provided such as source follower transistors (not shown), and row select transistors (not shown). At this point, masked p-well implant regions 206a can be formed within the substrate 202, if desired. P-well regions 206a could be formed before or after gate stack formation.

Figure 7D:
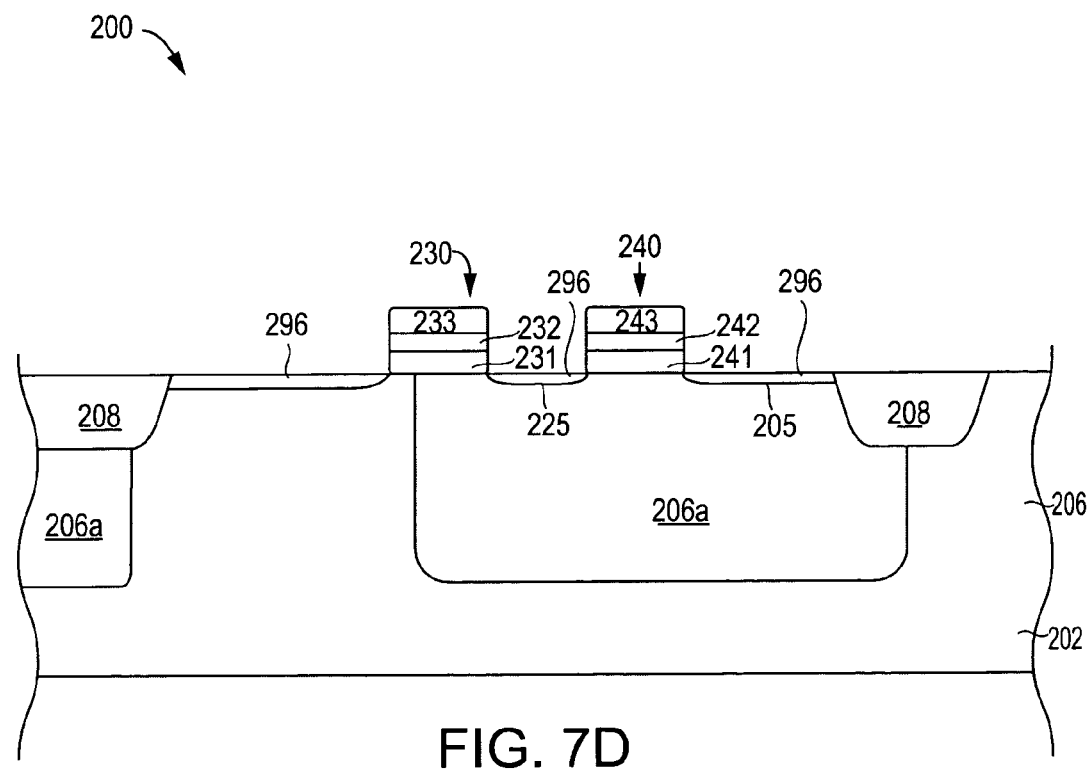

Next, FIG. 7D illustrates a source/drain oxide layer 296 formed as a result of a source/drain oxidation process. The source/drain oxidation process is typically conducted to improve the gate oxide layers 231 and 241 characteristics. The function and characteristics of the source/drain oxide layer 296 is analogous to the source/drain oxide layer 196 previously described with reference to FIG. 5D. FIG. 7D also illustrates n-type LDD implant regions 225 and 205.

It should be appreciated that while the source/drain oxide layer 296 has several advantages including improving gate oxide reliability, it is not a required step for the present invention. If the source/drain oxide layer is either not done or later removed, the subsequent implant energies used to form regions 204a and 235 can be decreased since the regions 204a and 235 are being formed without implanting through an oxide layer 296.

In a conventionally formed cell, such as the imager cell 10 illustrated in FIGS. 2 and 3, the pinned photodiode 11 is formed after spacer oxide 95 deposition. In the present invention, the pinned photodiode 211 is advantageously formed after a source/drain oxidation process, and more preferably, forming at least the charge collection region 235 after a source/drain oxidation step to reduce problems associated with oxidation diffusion that prior art photodiodes 11 suffer from. An alternate implant location for forming charge collection region 235 is after gate stack formation and prior to source/drain oxidation; but, implanting after source/drain oxidation is preferred.

Forming a photodiode after a source/drain oxidation step results in a photodiode 211 that is less diffused and more sharply defined since the dopant ions comprising regions 204a and 235 will not diffuse outwards as a result of the enhanced oxidation diffusion due to the source/drain oxidation.

Furthermore, it should also be appreciated that photodiode 211 is formed by selective implantation i.e., the region where the photodiode is to be formed is the only area of the substrate that is subject to photodiode implantations. Other regions of the pixel cell 200 are protected from the photodiode implantations by methods well-known in the art. For instance, a resist or mask (not illustrated) and an opening in the resist or mask can be provided such that only the region that will become photodiode 211 is subject to photodiode implantation.

Figure 7E:
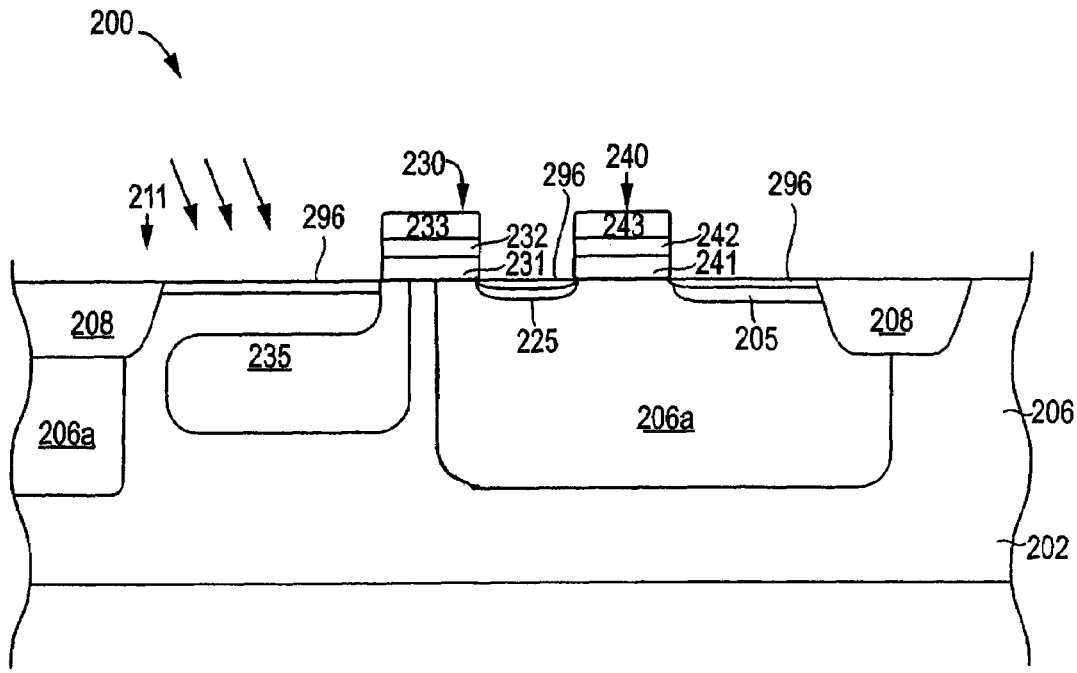
Figure 7F:
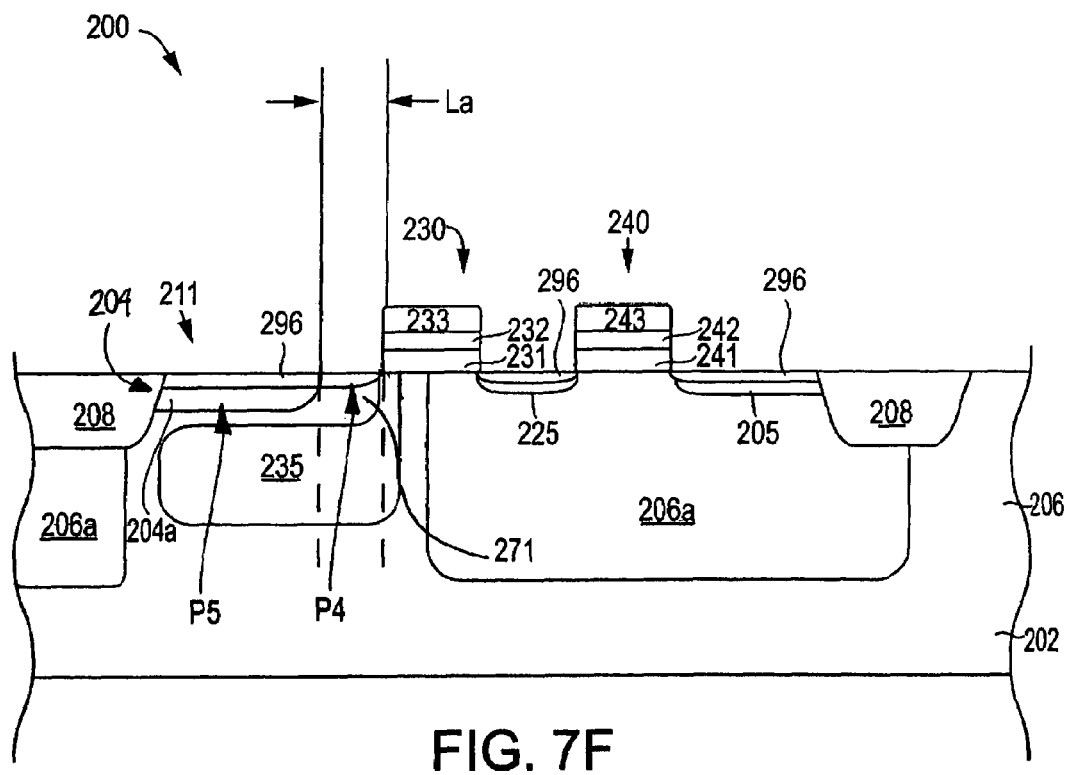

Referring now to FIGS. 7E–7F, a p-n-p pinned photodiode 211 is formed by regions 204a, 271, 235 and 206 after the source/drain oxidation step of FIG. 7D is completed. All of these regions 204a, 271, 235 and 206 are formed to a predetermined dopant concentration except for region 271 which is formed with no photodiode p-type implantations.

As a result, region 204a is formed to have a p+ dopant concentration and region 235 is formed to have an n-type dopant concentration.

A p-type doped region 206 i.e., epitaxial region ("p-epi"), is part of the substrate 202 starting material. Typically, the p-type doping of the p-epi is chosen to be appropriate for the image sensor. However, the p-type doped regions 206 could be formed by high energy ion implantation and diffusion. If desired, p-wells 206a can be formed within the substrate 202. As described above, the p-well regions 206a may be formed before or after the formation of trench isolation regions 208. P-type dopant ions such as boron or indium, among others, may be used in forming any of the p-type regions within pixel cell 200.

Moreover, for p-type implants, $BF_2$ is preferred as one can achieve the same shallow depth as $B^{11}$ with an easier to control and higher $BF_2$ implant energy. For instance, p-type region 204a, if implanted with $BF_2$, can be implanted with an implant energy of from about 1 to about 40 keV, and preferably from about 3 to about 20 keV.

The n-type region 235 is formed by implanting dopants which for exemplary purposes is n-type. The n-type region 235 is preferably formed with a low energy angled arsenic (As) or antimony (Sb) dopant implantation step. However, other n-type dopant ions, such as phosphorus, can be employed if a low energy angled implant is used.

FIG. 7E illustrates the n-type region 235 advantageously angled towards the adjacent gate, here the transfer transistor gate stack 230. The n-type region 235 may be formed by multiple implants using implant angles of from about 0 to about 30 degrees, and preferably of from about 0 to about 15 degrees. If arsenic is employed as the n-type dopant ion, an implant energy of from about 30 to about 300 keV, and preferably from about 50 to about 200 keV can be used.

The implant energy for arsenic is greater than the implant energy for antimony which is greater than the implant energy for phosphorus to achieve the same n-type implant depth. The implant energies for Sb and phosphorus would need to be lower than the implant energy for As to achieve the same depth as is well-known in the art. Arsenic is preferred as the n-type dopant ion used to form n-type region 235 since it has the lowest diffusivity.

In a conventionally formed charge collection region, such as region 35 illustrated in FIGS. 2 and 3, phosphorus is the n-type dopant ion used and the n-type region 35 is formed deep within substrate 2 through a series of high energy vertical implants.

In the present embodiment, employing a low energy As or Sb angled implantation process allows an n-type implant region 235 with a shallower doping profile to be formed due to the low energy implant or low diffusivity of the n-type dopant ion used. As a result, the n-type neck 24 of FIG. 2, which does not transfer collected charge efficiently to the adjacent transfer gate 30, becomes a strong n-type neck region 224 (FIG. 6). The strong n-type neck region 224 (FIG. 6) of pinned photodiode 211 reduces the barriers and wells associated with conventionally formed photodiodes.

Moreover, arsenic and antimony have a lower diffusivity than phosphorus. Typically, as the substrate 2 (FIGS. 2 and 3) is heated up, as in a source/drain oxidation process, rapid thermal process, or diffusion process, phosphorus becomes extremely mobile in the substrate and diffuses outwards. Conversely, employing the methods of the present invention of FIGS. 6–7H, yields a sharper n-type profile in the photodiode 211 and the charge collection region 235 transfers collected charge to the transfer gate 230 more efficiently.

Further, the n-type region 235 is formed by an angled implantation into or towards the transfer gate 230 to achieve a self-aligned implant with respect to the edge of the transfer gate 230. Implanting the n-type dopant ions after a source/drain oxidation process eliminates the oxidation diffusion associated with prior art photodiode charge collection regions 35 (FIGS. 2 and 3). Since the n-type region 235 has a shallow doping profile with respect to the surface of the substrate 202, there is no punch-through current problem that is normally associated with deep n-type charge collection regions (FIGS. 2 and 3).

Referring now to FIG. 7F, the graded p-type pinned surface layer 204 comprising regions or sub-regions 204a and 271 is formed by conducting a low energy angled implantation with dopant ions which for exemplary purposes are p-type, such that p-type ions are implanted over the n-type region 235. It should be appreciated that the p-type pinned surface layer 204a can be formed by methods other than implantation as is known in the art. It should also be appreciated that the order of the p-type and n-type implantations in forming photodiode 211 is not important.

Still referring to FIG. 7F, the p-type pinned surface layer 204a is a doped p+ region and is formed with an angled implantation having an angle of from about 2 to about 30 degrees, and is preferably of from about 2 to about 15 degrees. The p-type region 204 is formed by an angled implantation that is preferably angled away from the edge of the transistor gate 230. The implant angle used to form region 204 is defined as $\theta_c$.

The p-type pinned surface region 204a is preferably formed with $BF_2$ dopant ions. As discussed previously, $BF_2$ is preferred as one can achieve the same shallow depth as $B^{11}$ with an easier to control and higher $BF_2$ implant energy. For instance, p-type region 204a, if implanted with $BF_2$, can be implanted with an implant energy of from about 1 to about 40 keV, and preferably from about 3 to about 20 keV.

It should be appreciated that region 204a is considered a p+ region since it has a high p-type dopant ion concentration p-type region 206. In the present invention, the p+ region 204a is formed to be less than about $1.0 \times 10^{15}/cm^2$ and greater than about $1.0 \times 10^{12}/cm^2$.

It should further be appreciated that the lateral profile of the pinned surface region 204a can be manipulated depending upon the desired characteristics of the pinned photodiode 211. As a result of the angled implant, region 204a is self-aligned to the adjacent gate edge, here the edge of transfer gate 230, but is spaced away by a distance $L_c$ which is equal to the gate stack height multiplied by $\text{Tan}\theta_c$(transfer gate stack height$\times \text{Tan}\theta_a$). For instance, if the gate stack height of transfer gate 230 is 2500 Å and $\theta_c$ is 10 degrees, then $L_c$ is 441 Å. In other words, implant region 204a is offset from the transfer gate 230 by 441 Å. It should also be appreciated that region 271 will be 441 Å wide. Thus, calculating $L_c$ also determines the width of region 271.

Region 204a is formed with an implant dose of from less than about $1.0 \times 10^{15}/cm^2$ and greater than about $1.0 \times 10^{12}/cm^2$, preferably from about $2.0 \times 10^{12}/cm^2$ to about $1.0 \times 10^{14}/cm^2$, and even more preferably with a dose concentration of from about $6.0 \times 10^{12}/cm^2$ to about $5.0 \times 10^{13}/cm^2$.

The p-type pinned surface region 204a also has a shallow doping profile with respect to the surface of the substrate 202 since the angled implantation step is carried out with a low energy implant. In a conventionally formed p-type pinned surface layer 4, as illustrated in FIGS. 2 and 3, the p-type pinned surface layer 4 is formed after spacer insulator oxide layer deposition 95. As a result, a conventional p-type pinned surface layer 4 is formed with a $BF_2$ implant energy greater than 40 keV, resulting in significant implant straggle i.e., wide distribution in the p-type pinned surface layer's profile.

In contrast, as illustrated in the present exemplary embodiment, forming the p-type pinned surface region 204a after a source/drain oxidation process and before spacer insulator oxide layer 295 deposition, requires a $BF_2$ implant energy less than or equal to 40 keV. Since the energy of the p-type surface implant 204a is much lower, a shallow doping profile with respect to the surface of the substrate 202 can be achieved and implant straggle is significantly reduced.

It should be appreciated that the p-type pinned surface layer 204 can be formed before or after source/drain oxidation. However, it is preferable that the p-type pinned surface layer 204a is formed after source/drain oxidation, and even more preferable, prior to spacer insulator oxide layer 295 deposition which forms sidewall spacers on the sides of gate stacks 230 and 240.

If the implant used to form region 204a is conducted after the spacer oxide layer 295 deposition, the implant can still be conducted as an angled implant and will still result in a region 204a that is self-aligned to the edge of the transfer gate 230. In this case, the implant will receive an additional lateral displacement from the edge of the transfer gate 230 as a result of the sidewall spacer thickness. In addition, the implant energy will need to be increased to compensate for the implant getting through the spacer oxide layer's 295 thickness.

FIG. 7F illustrates two defined photodiode surface regions or sub-regions: P4 and P5. Region 4 (P4) i.e., region 271, does not have any photodiode implant ions at all, so long as $\theta_c$ is greater than 0 degrees. Region 5 (P5) i.e., region 204a is formed with a photodiode p-type implantation. As a result, the dopant concentration in the P5 region is always greater than the P4 region.

Figure 7G:
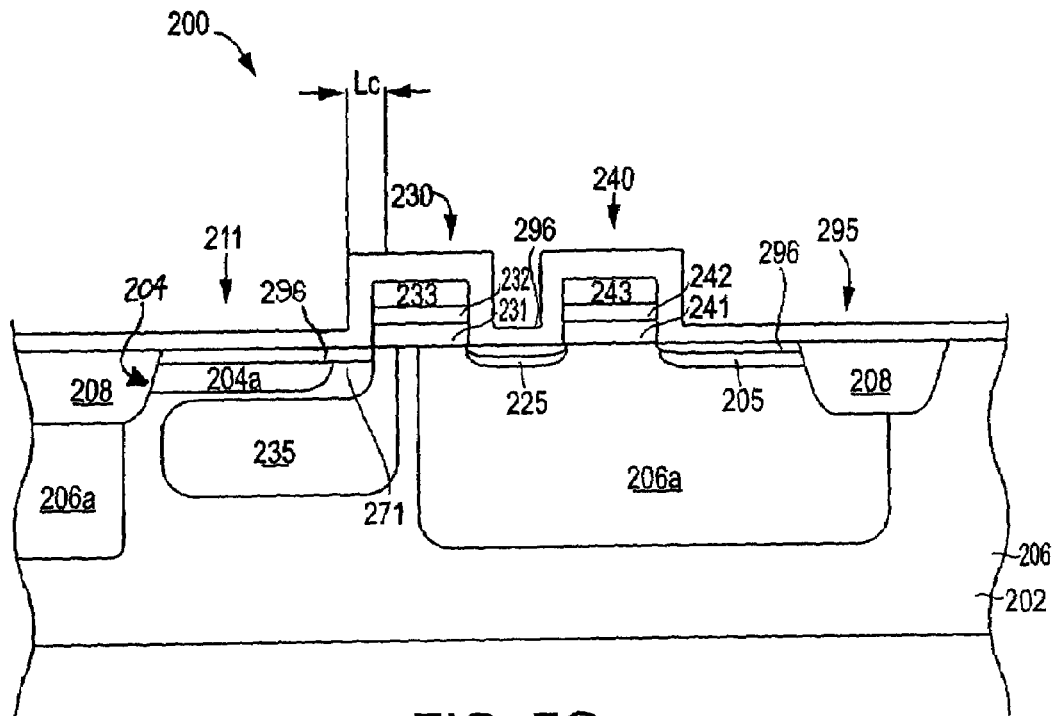
Figure 7H:
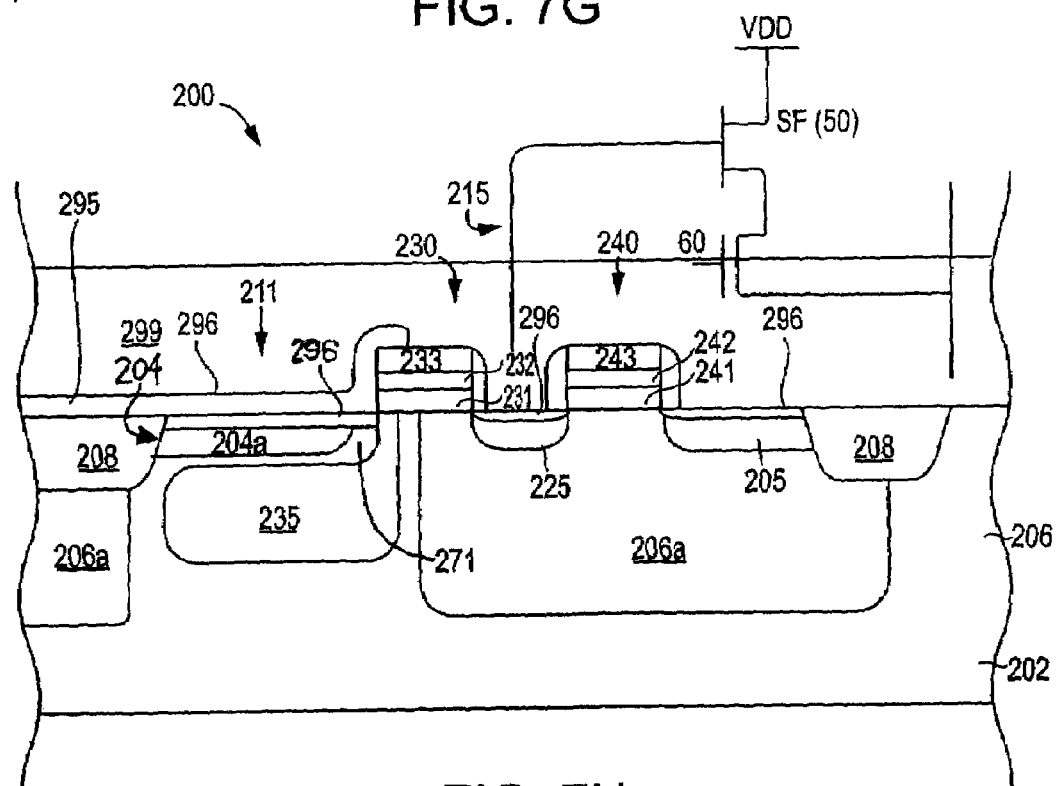

Referring now to FIG. 7G, a spacer insulator oxide layer 295 is deposited over the substrate 202. Then, insulating sidewall spacers 234 and 244 are formed on the sides of the gate stack 230 and 240 through conventional methods as illustrated in FIG. 7H. The sidewall spacers 234 and 244 may be formed, for example, of silicon dioxide, silicon nitride, silicon oxynitride, ON, NO, ONO or TEOS, among others. As mentioned previously, the p+ pinned surface region 204a can be formed after depositing the oxide layer 295, if desired.

After the sidewall spacers 234 and 244 are etched, impurity doped source/drain regions can be formed. FIG. 7H illustrates forming impurity doped source/drain regions 205 and 225 for the transfer transistor gate 130 and reset transistor gate 240 using a masked spacer etch that masks the spacer etch from the photodiode region 211. It should be appreciated that the impurity doped source/drain region 205 can have a different dopant concentration from the commonly shared impurity doped floating diffusion region 225 of the transfer transistor gate 230. The impurity doped source/drain region 205 and impurity doped source/drain region 225 can be formed by conventional methods known in the art.

It should be appreciated that if desired, the pinned photodiode 211 can be formed after the spacer etch rather than after gate stack formation (FIG. 7C). In this embodiment, after the spacer etch, a bare silicon substrate 202 (not illustrated) would result. The subsequent implant energy used to form the pinned photodiode 211 could then be accordingly decreased, if desired, since the photodiode would be formed without implanting through an oxide layer.

The CMOS pixel cell 200 is then processed to produce an operative pixel by conventional processing methods that form insulating, shielding, and metallization layers to connect gate lines and other connections to the pixel sensor cells. For instance, as FIG. 7H illustrates, a transparent insulating layer or passivation layer 299, for example, silicon dioxide, BSG, PSG, or BPSG, can be provided over the entire surface which is CMP planarized and etched to provide an opening and a metal conductor 215 can be used to connect the impurity doped floating diffusion region 225 with a source follower transistor 50 and row select transistor 60. Additional layers of conductors and insulators may also be used to interconnect the structures and to connect the pixel cell 200 to peripheral circuitry.

As a result, the method and structure illustrated in FIGS. 6–7H provide greater control of the implant doping profile of the photodiode 211 near the edge of the transfer gate 230 while giving good reproducibility of the pinning voltage $V_{pin}$. The photodiode's 211 capacitance is increased due to the shallow implants. For instance, in a preferred embodiment, the angled implantations used to form photodiode 211 are conducted prior to space oxide 295 deposition. This allows for separate optimization of the photodiode 211 for image performance and the transistor spacer process for transistor performance.

Since the p+ type region 204a is formed with a low energy angled implant, the shallow doping profile of the p+ region 204a, with respect to the surface of the substrate 202, improves the ability of the n-type region 235 to transfer collected charge to the transfer gate 230 by reducing the compensation of the n-type implant by the p+ implant. Moreover, the shallow doping profile of the p+ region 204a and n-type region 235, with respect to the surface of the substrate 202, allows a sharply-defined photodiode 211 to be formed. The n-type dopant ions from region 235 and p-type dopant ions from region 204a do not diffuse outwards into the substrate 202 and eliminates barriers normally associated with conventional photodiodes.

Accordingly, the result is an imager cell 200 with a pinned photodiode 211 comprising a shallow p-type surface region 204a, a separation region 271, and a shallow n-type charge collection region 235, having a strong n-type neck region 224 which is adjacent to the transfer gate 230. The imager cell 200 has improved barrier, image lag, transfer gate leakage, and photodiode dark current performance. It should be appreciated that the structure and methods of FIGS. 6–7H can be employed with equal effectiveness to CCD Imagers and other CMOS imagers where the gate adjacent to the photodiode may not be a transfer gate, but instead, a global shutter, storage gate, or high to dynamic range gate.

Referring now to FIG. 8, pixel cell 300 constructed in accordance with one exemplary embodiment and method of the present invention is shown having a photodiode 311 with a shallow doping profile, with respect to the top surface of the substrate 302, and a graded p-type pinned surface layer 304. The graded pinned p-type surface layer 304 comprises three different regions or sub-regions: a first region 304a with a p+ dopant concentration, a second region 304b with a p-type dopant concentration, and a third region or separation region 371 having no photodiode implantations i.e., no photodiode p-type implantations.

It should be appreciated that the p-type surface layer 304 is defined as a graded surface layer since it has regions or sub-regions of varying dopant concentrations. For instance, region 304a i.e., sub-region 304a has a higher dopant concentration than region 304b i.e., sub-region 304b. In contrast, separation region 371 i.e., sub-region 371 does not have any photodiode p-type implantations.

The third region 371 does not have photodiode 311 p-type implantations. In the course of transistor processing, blanket p-type enhancement implants are typically used to set the transistor's $V_t$. Such a blanket p-type implant would be implanted across the entire photodiode 311. As a result, the lateral p-type gradient would still be maintained. Stated in another manner, the third region 371 is formed to have no photodiode p-type implantations or photodiode implantations; however, subsequent processes could implant dopant ions into region 371 if desired. In essence, the third region 371 is a separation region that separates the graded p-type surface layer's 304a and 304b from the n-type region 335 and edge of the transistor gate 330.

It should also be appreciated that the first region 304a is considered a p+ region since it has a greater p-type dopant ion concentration than region 304b. In the present invention, the p+ region 304a is formed to be less than about $1.0 \times 10^{15}/\text{cm}^2$ and greater than about $1.0 \times 10^{12}/\text{cm}^2$.

The illustrated pixel cell 300 includes the p-n-p photodiode 311 structure formed by regions 304a, 304b, 371, 306 and 335. The p-type doped region 306 is formed in the areas of the substrate 302 as part of the p-type starting material. The p-type doped region 306 can be formed as p-wells 306a, if desired. The n-type region 335 is formed by implanting dopant ions which for exemplary purposes is n-type.

The n-type doped region 335 forms a photosensitive charge collection region for collecting photo-generated electrons. The n-type region 335 is advantageously angled towards the adjacent gate, here, the transfer transistor gate 330. The n-type region 335 may be formed by multiple implants using implant angles of from about 0 to about 30 degrees, and preferably of from about 0 to about 15 degrees. The n-type doped region 335 is preferably formed from arsenic (As) or antimony (Sb) dopant ions rather than phosphorus. In addition, the n-type doped region 335 has a shallow doping profile with respect to the top surface of the substrate 302.

The graded p-type surface layer 304 comprises a first region or sub-region 304a with a p+ dopant concentration, a second region or sub-region 304b with a p-type dopant concentration, and a third region or sub-region 371 having no photodiode implants. The second region 304b is not doped to have a p+ dopant concentration and thus, has a lower dopant concentration than the first region 304a. The first region 304a is a p+ region that possesses a dopant gradient i.e., a gradient profile. Specifically, the concentration of dopant ions is greater near the top surface of region 304a than the concentration found within substrate 302 for region 304a.

The graded p-type pinned surface layer 304 is formed by conducting dual photodiode implantations i.e., two angled implants, with dopant ions which for exemplary purposes is p-type. The dopant concentration of the p-type pinned surface layer region 304a is preferably greater than the dopant concentration of the p-type pinned surface layer region 304b. The separation region 371 of pinned photodiode 311 has no p-type photodiode dopant ions. The p-type pinned surface region 304a has preferably a deeper doping profile with respect to the top surface of the substrate 302, than the p-type pinned surface region 304b. In other words, p-type pinned surface region 304b is formed to be shallower than p-type region 304a with respect to the top surface of the substrate 302.

The p-type pinned surface region 304a is a doped p+ region and is formed with an angled implantation having an angle from about 2 to about 30 degrees, and is preferably from about 2 to about 15 degrees. The p-type pinned surface region 304b is formed with a lower energy implant than the implant energy used to form the p-type pinned surface region 304a, and is formed with an angled implantation having an angle from about 0 to about 15 degrees, and preferably from about 0 to about 10 degrees. The p-type region 304a is formed such that it primarily sets the pinning voltage ($V_{pin}$) of the photodiode 311 to a desired level.

Region 304a is formed with an implant dose of from less than about $1.0 \times 10^{15}/\text{cm}^2$ and greater than about $1.0 \times 10^{12}/\text{cm}^2$, preferably from about $2.0 \times 10^{12}/\text{cm}^2$ to about $1.0 \times 10^{14}/\text{cm}^2$, and even more preferably with a dose concentration of from about $6.0 \times 10^{12}/\text{cm}^2$ to about $5.0 \times 10^{13}/\text{cm}^2$. Region 304b is preferably formed with an implant dose of from about $1.0 \times 10^{12}/\text{cm}^2$ to about $6.0 \times 10^{13}/\text{cm}^2$, and more preferably with a dose concentration of from about $3.0 \times 10^{12}/\text{cm}^2$ to about $4.0 \times 10^{13}/\text{cm}^2$.

It should be appreciated that the lateral profile of the pinned surface regions 304a and 304b can be manipulated depending upon the desired characteristics of the pinned photodiode 311. Both implants 304a and 304b are self-aligned with respect to the adjacent gate edge, in this case, the transfer gate 330. Thus, both implants 304a and 304b may be angled and thereby offset by a distance $L_a$ and $L_b$, respectively, from the edge of the transfer gate 330. The calculation of $L_a$ and $L_b$, proceeds in a similar manner as described in reference to implant regions 104a and 104b of FIGS. 4–5H. In addition, $L_b$ also corresponds to the width of separation region 371. Thus, if $L_b$ is 219 Å, then region 371 is 219 Å wide.

The presence of region 304b having a shallow doping profile with respect to the top surface of the substrate 302, allows the n-type region 335 to have a sharper profile since there is not a doped p+ region adjacent to the edge of the transfer gate 330 with the presence of separation region 371. In addition, there is less chance for the p-type dopant ions comprising region 304b to diffuse into and interact with the n-type region 335 with the presence of separation region 371.

As a result, FIG. 8 illustrates three defined photodiode surface regions or sub-regions: P1, P2 and P3. Region 1 (P1) comprises region 371, is formed without photodiode p-type implantations, so long as $\theta_a$ is greater than 0 degrees and $\theta_b$ is greater than 0 degrees. Region 2 (P2) comprises implant region 304b. Region 3 (P3), comprises both implant regions 304a and 304b. Thus, the dopant concentration in the P3 region is always greater than the P2 region, independent of the implant dose concentrations used when forming regions 304a and 304b. Further, since the P2 region has a smaller dopant concentration than the P3 region, the P2 region will also be shallower (i.e., have a shallower doping profile), even if region 304a and 304b are implanted with the same implant energy. Still further, the P3 region has a graded dopant profile. In other words, the top surface of the P3 region has a greater dopant concentration than the P3 region found deeper within the substrate 302.

In addition, there is less chance for punch-through currents due to region 335 since the region 335 is formed to a shallower depth than conventionally formed deep n-region implants as illustrated in FIGS. 2 and 3. Moreover, region 335 does not have a long neck 24 that is typically associated with conventionally formed n-type region 35 (FIGS. 2 and 3). Thus, there is less chance for the p-type dopant ions comprising regions 304a and 304b to diffuse into and interact with the n-type region 335 with the presence of separation region 371.

FIG. 8 also illustrates a multi-layered transfer transistor gate 330 and reset transistor gate 340 formed over the semiconductor substrate 302. For exemplary purposes, the substrate 302 is a silicon substrate. However, as noted above, the invention has equal utility with other semiconductor substrates.

The transfer transistor gate 330 comprises a gate oxide layer 331, a conductive layer 332, and, if desired, an insulating layer 333. If desired, a silicide layer or metal layer (not shown) may be also formed in the multi-layered gate stack 330, between the conductive layer 332 and the insulating layer 333. FIG. 8 illustrates an insulating sidewall spacer 334 formed on one side of the transfer transistor gate 330 with spacer insulator oxide layer 395.

The reset transistor gate 340 comprises a gate oxide layer 341, a conductive layer 342, and, if desired, an insulating layer 343. If desired, a silicide layer or metal layer (not shown) may also be formed in the multi-layered gate stack 340, between the conductive layer 342 and the insulating layer 343. The illustrated pixel 300 also includes insulating sidewall spacers 344 formed on both sides of the reset transistor gate 340.

The reset transistor gate 340 has an impurity doped source/drain region 305 and shares an impurity doped common source/drain region 325 with the transfer transistor gate 330. The common impurity doped source/drain region 325 is typically known as a floating diffusion region. The multi-layered transfer gate 330 transfers charge accumulated in the charge collection region 335 of the photodiode 311 to the floating diffusion region 325.

Field oxide regions 308 often referred to as trench isolation regions are formed in the substrate 302 separating adjacent pixel cells. In an exemplary embodiment, the trench isolation regions 308 are STI regions. Field oxide regions could also be formed using a LOCOS process.

A method of forming the pixel cell 300 of FIG. 8 is now described with reference to FIGS. 9A–9H.

Figure 9A:
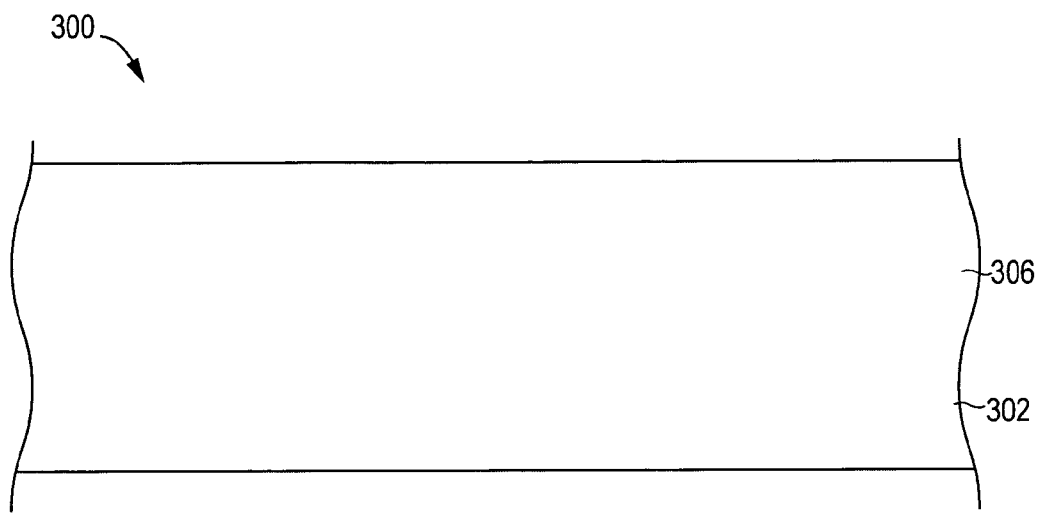
FIG. 9A–9H are cross-sectional views of the CMOS imager pixel cell of FIG. 8 at various stages of formation in accordance with an exemplary embodiment of the invention.

FIG. 9A illustrates a substrate 302 along a diagrammatic side sectional view of a CMOS image structure formed in accordance with an embodiment of the present invention. For exemplary purposes, the substrate 302 is a silicon substrate formed to a predetermined thickness. In the case shown, the substrate 302 is a p-type silicon substrate 302; but, it is also possible to use p-epi, p+, or n-type silicon substrates.

Figure 9B:
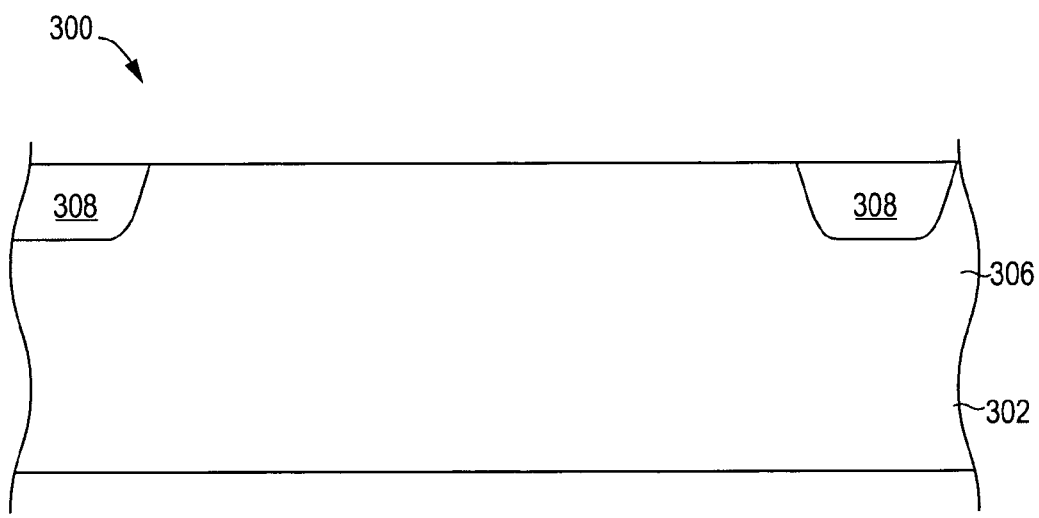

Referring now to FIG. 9B, trench isolation regions 308 are formed within the substrate 302 to separate the pixel cell 300 from adjacent pixel cells. The trench isolation regions 308 are formed in an analogous manner as described with reference to FIGS. 5B and 7B. In a preferred embodiment, the trench isolation regions 308 are STI regions and the dielectric material is a high density plasma (HDP) oxide.

Figure 9C:
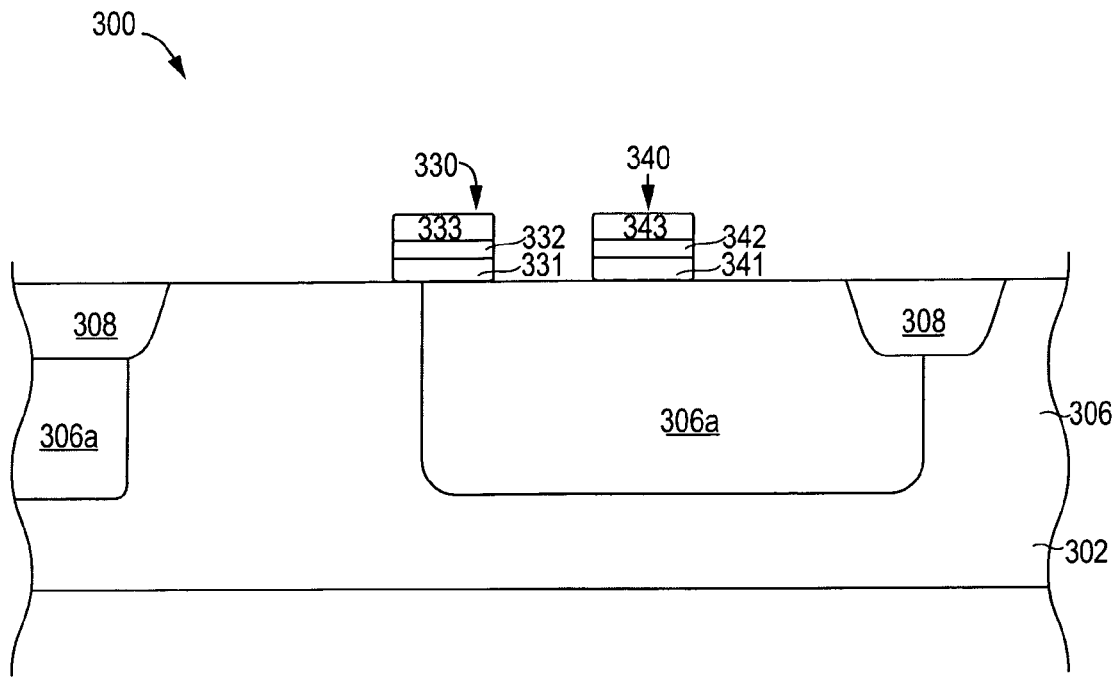

FIG. 9C illustrates a transfer transistor gate 330 and reset transistor gate 340 formed over the substrate 302. The transfer transistor gate 330 and reset transistor gate 340 are formed in a similar manner as described in reference to FIGS. 5C and 7C in forming transfer gate 130, 230 and reset gate 140, 240. In addition, other transistor gate stacks can be concurrently formed, if desired. At this point, masked p-well implant regions 306a can be formed within substrate 302, if desired. P-well regions 306a can be formed before or after gate stack formation.

Figure 9D:
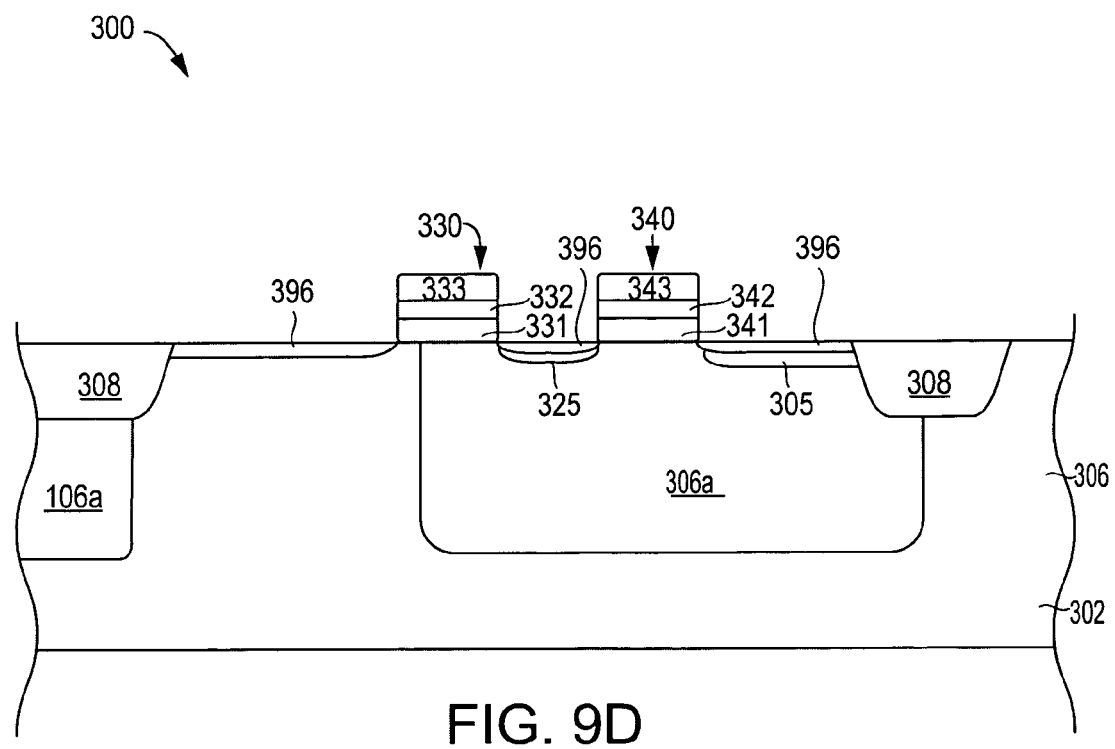

Next, FIG. 9D illustrates a source/drain oxide layer 396 formed as a result of a source/drain oxidation process. The source/drain oxidation process is typically conducted to improve the gate oxide layers 331 and 341 characteristics. The function and characteristics of the source/drain oxide layer 396 is analogous to the source/drain oxide layer 196 and 296 previously described with reference FIG. 5D and FIG. 7D, respectively. FIG. 9D also illustrates n-type LDD implant regions 325 and 305.

It should be appreciated that while the source/drain oxide layer 396 has several advantages including improving gate oxide reliability, it is not a required step for the present invention. If the source/drain oxide layer is either not done or later removed, the subsequent implant energies used to form regions 304a, 304b, and 335 can be decreased since the regions 304a, 304b, and 335 are being formed without implanting through an oxide layer 396.

It should also be appreciated that photodiode 311 is formed by selective implantation i.e., the region where the photodiode is to be formed is the only area of the substrate that is subject to photodiode implantations. Other regions of the pixel cell 300 are protected from the photodiode implantations by methods well-known in the art. For instance, a resist or mask (not illustrated) and an opening in the resist or mask can be provided such that only the region that will become photodiode 311 is subject to photodiode implantation.

Figure 9E:
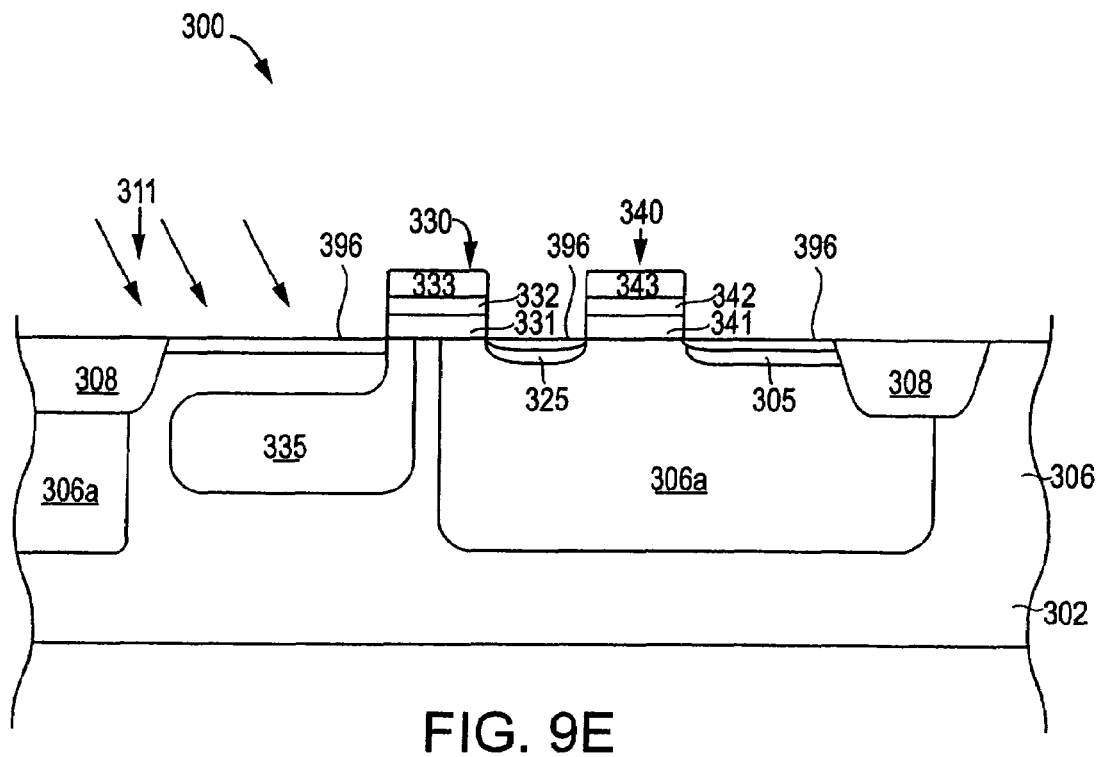
Figure 9F:
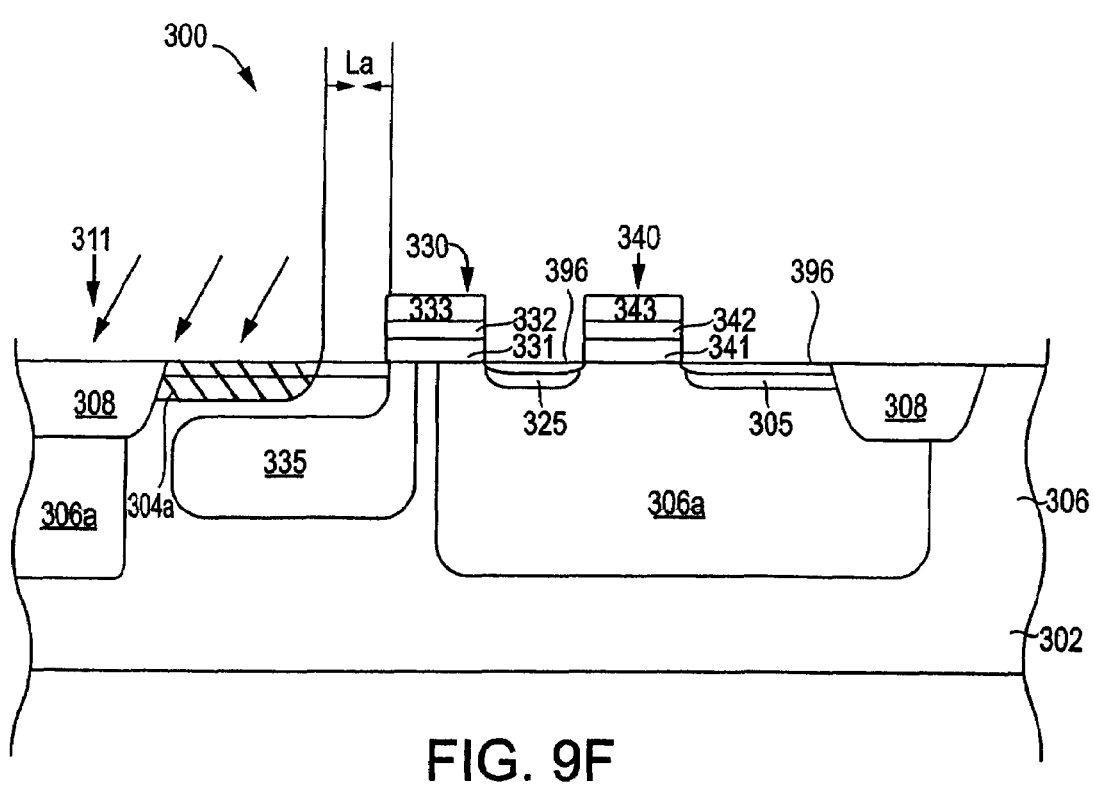

Referring now to FIGS. 9E–9F, a p-n-p pinned photodiode 311 is formed by regions 304a, 304b, 371, 335 and 306, preferably after the source/drain oxidation step. All of these regions are formed to a predetermined dopant concentration except for region 371 which is formed with no photodiode p-type implantations. For example, region 304a is formed to have a p+ dopant concentration. Region 304b is formed to have a p-type dopant concentration which is less than the p+ dopant concentration in region 304a. Region 335 is formed to have an n-type dopant concentration.

For the same implant depth, $BF_2$'s implant energy is greater than the implant energy for $B^{11}$. Thus, for p-type implants, $BF_2$ is preferred as one can achieve the same shallow depth as $B^{11}$ with an easier to control and higher $BF_2$ implant energy. For instance, p-type regions 304a and 304b, if implanted with $BF_2$, can be implanted with an implant energy of from about 1 to about 40 keV, and preferably from about 3 to about 20 keV.

A p-type doped region 306 i.e., epitaxial region, is part of the substrate 302 starting material. Typically, the p-type doping of the p-epi is chosen to be appropriate for the image sensor. However, the p-type doped regions 306 could be formed by high energy ion implantation and diffusion. If desired, p-wells 306a can be formed within the substrate 302. As described above, the p-well regions 306a may be formed before or after the formation of trench isolation regions 308. P-type dopant ions such as boron or indium, among others, may be used in forming any of the p-type regions within pixel cell 300.

The n-type region 335 is formed by implanting dopants which for exemplary purposes is n-type. The n-type region 335 is preferably formed with a low energy angled arsenic (As) or antimony (Sb) dopant implantation step since they have a low diffusivity. However, other n-type dopant ions, such as phosphorus, can be employed if a low energy angled implant is used.

FIG. 9E illustrates the n-type region 335 advantageously angled towards the adjacent gate, here, the transfer gate 330. The n-type region 335 may be formed by multiple implants using implant angles of from about 0 to about 30 degrees, and preferably of from about 0 to about 15 degrees. If As is employed as the n-type dopant ion, an implant energy of from about 30 to about 300 keV, and preferably from about 50 to about 200 keV can be used.

As a result, a shallow profile n-type region 335 is formed with respect to the top surface of the substrate 302 and with similar advantages as discussed in reference to the n-type region 235 of FIG. 7E.

Referring now to FIG. 9F, the graded p-type pinned surface layer 304 comprising sub-regions 304a, 304b and 371 are formed by conducting a first and second dopant implantation e.g., dual angled dopant implantations, with dopant ions which for exemplary purposes are p-type, such that p-type ions are implanted over the n-type region 335. The formation of the p-type pinned surface layers 304a and 304b can proceed in a similar manner as described above with reference to FIGS. 5A–5F and pinned layers 104a and 104b. It should also be appreciated that the order of the p-type and n-type implantations in forming photodiode 311 is not important.

The dopant concentration of the p-type pinned surface layer region 304a is preferably greater than the dopant concentration of the p-type pinned surface layer region 304b, such that region 304a is formed as a doped p+ surface region 304a. The doped p+ pinned surface region 304a has preferably a deeper doping profile, with respect to the top surface of the substrate 302, than the p-type pinned surface region 304b. In essence, the formation of the doped p+ region 304a is carried out with a higher energy than the implant energy used to form p-type region 304b. Stated in another manner, p-type pinned surface region 304b is formed to be shallower than p-type region 304a with respect to the top surface of substrate 302.

The p+ pinned surface region 304a is formed first with an angled implantation having an angle of from about 2 to about 30 degrees, and is preferably of from about 2 to about 15 degrees. This first angled implantation is preferably angled away from the edge of the transistor gate 330. The implant angle used to form region 304a is defined as $\theta_a$. As a result of the angled implant, region 304a is self-aligned to the adjacent gate edge, here the edge of transfer gate 330, but is spaced away by a distance $L_a$ which is equal to the gate stack height multiplied by $Tan\theta_a$ (transfer gate stack height × $Tan\theta_a$).

Region 304a is formed with an implant dose of from less than about $1.0\times10^{15}/cm^2$ and greater than about $1.0\times10^{12}/cm^2$, preferably from about $2.0\times10^{12}/cm^2$ to about $1.0\times10^{14}/cm^2$, and even more preferably with a dose concentration of from about $6.0\times10^{12}/cm^2$ to about $5.0\times10^{13}/cm^2$. The implant angle $\theta_a$, used to form region 304a, will set the lateral location where the p-type implant gradient transitions from implant region 304a to region 304b.

Figure 9G:
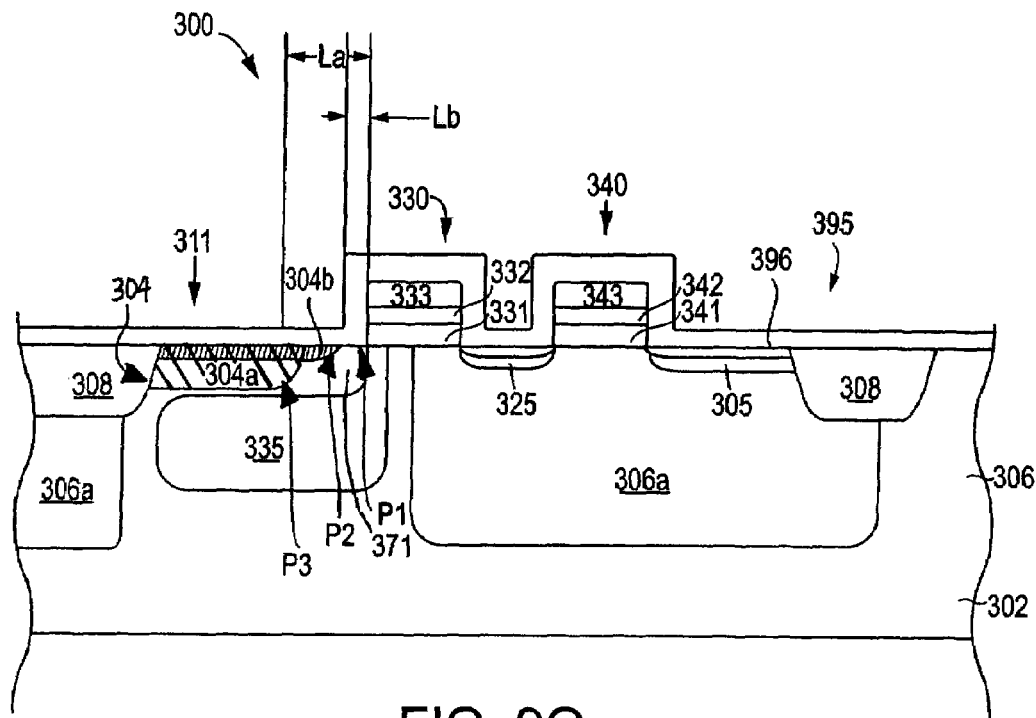

Referring now to FIG. 9G, p-type surface region 304b is formed after forming the doped p+ surface region 304a in a similar fashion as described with reference to the p-type surface region 104b of FIG. 5E. Pinned surface layer 304b can be formed with a lower energy angled implant than what is used to form region 304a. Region 304b is formed with an implantation having an angle of from about 0 to about 15 degrees, and preferably of from about 0 to about 10 degrees. If an angled implant is used to form region 304b, it should be angled away from the edge of the transistor gate 330.

It should be appreciated that portions of region 304a is further doped with the dopant ions used to form region 304b. As a result, the top surface of region 304a has a higher dopant concentration than the 304a region found deeper within substrate 302 i.e., region 304a has a dopant gradient.

The implant angle used to form region 304b is defined as $\theta_b$. As a result of the angled implant, region 304b is self-aligned to the adjacent gate edge, here the edge of transfer gate 330, but is spaced away by a distance $L_b$ which is equal to the gate stack height multiplied by $Tan\theta_b$ (gate stack height × $Tan\theta_b$).

A lower energy can also be used for this second implant 304b to control the depth of the second implant. For instance, a low energy implant keeps the p-type region's 304b doping profile much shallower with respect to the top surface of the substrate 302, near the transfer gate 330 than p-type region's 304a doping profile. The p-type region 304b is preferably formed with an implant dose of from about $1.0\times10^{12}/cm^2$ to about $6.0\times10^{13}/cm^2$, and preferably with an implant dose of from about $3.0\times10^{12}/cm^2$ to about $4.0\times10^{13}/cm^2$.

For p-type implants such as used in forming regions 304a and 304b, $BF_2$ is preferred as one can achieve the same shallow depth as $B^{11}$ with an easier to control and higher $BF_2$ implant energy. For instance, p-type regions 304a and 304b, if implanted with $BF_2$, can be implanted with an implant energy of from about 1 to about 40 keV, and preferably from about 3 to about 20 keV. Thus, the double photodiode implants taught in FIGS. 8–9H, results in a pinned surface region with a graded profile for a photodiode.

It should be appreciated that in FIG. 9G, three photodiode regions or sub-regions are defined: P1, P2 and P3. Region 1 (P1) comprising region 371, does not have any photodiode implants, so long as $\theta_a$ is greater than 0 degrees and $\theta_b$ is greater than 0 degrees. Region 2 (P2) comprises only implant region 304b. Region (P3), comprises both implant regions 304a and 304b. As a result, the dopant concentration in the P3 region is always going to be greater than the dopant concentration in the P2 region, independent of the implant doses used when forming regions 304a and 304b.

Further, since the P2 region is lower-doped than the P3 region, the P2 region will also be shallower (i.e., have a shallower doping profile) even if region 304a and 304b are implanted with the same implant energy. Still further, the P3 region has a graded dopant profile. In other words, the top surface of the P3 region has a greater dopant concentration than the P3 region found deeper within the substrate.

It should be appreciated that p-type angled implants, such as the first and second implants used to form regions 304a and 304b, can be conducted before or after the n-type region 335 is formed. In addition, the first and second implants used to form regions 304a and 304b can be done before or after spacer insulator oxide layer 395 deposition which forms sidewall spacers on the sides of gate stacks 330 and 340; it is just preferable that these implants be conducted before the spacer oxide deposition.

If the implants used to form regions 304a and 304b are conducted after the spacer oxide deposition, the implants can still be conducted as angled implants and will still result in regions 304a and 304b that are self-aligned to the edge of the transfer gate 330. In this case, the implants will receive an additional lateral displacement from the edge of the transfer gate 330 as a result of the sidewall spacer thickness. In addition, the implant energies will need to be increased to compensate for the implants getting through the spacer oxide layer's 395 thickness.

In another embodiment, the 304b implant is completely eliminated (not illustrated), if desired. However, a graded p-type surface implant region 304 would still be present due to region 304a being formed by angled implantation $\theta_a$. In this alternative embodiment, the surface p-type region 304 would consist of sub-regions P1 and P3. Region P3 would still comprise a p+ concentration i.e., 304a and region P1 i.e., 371 would not have photodiode p-type implants.

Figure 9H:
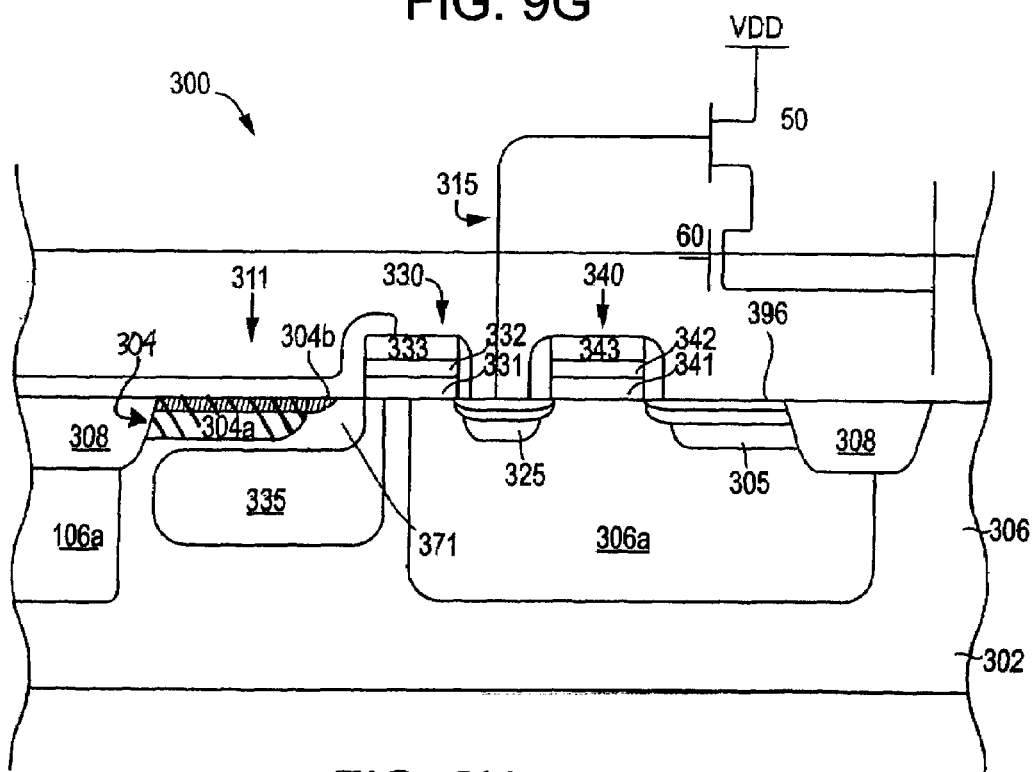

Still referring to FIG. 9G, a spacer insulator oxide layer 395 is deposited over the substrate 302. Then, insulating sidewall spacers 334 and 344 are formed on the sides of the gate stack 330 and 340 through conventional methods as illustrated in FIG. 9H. The sidewall spacers 334 and 344 may be formed, for example, of silicon dioxide, silicon nitride, silicon oxynitride, ON, NO, ONO or TEOS, among others. As mentioned previously, the pinned surface regions 304a and 304b can be formed after depositing the oxide layer 395, if desired.

Next, after the sidewall spacers 334 and 344 are formed, impurity doped source/drain regions can be formed. FIG. 9H illustrates forming impurity doped source/drain regions 325 and 305 for the transfer transistor gate 230 and reset transistor gate 240 using a masked spacer etch that masks the spacer etch from the photodiode region 311. It should be appreciated that the impurity doped source/drain region 305 can have a different dopant concentration from the commonly shared impurity doped floating diffusion region 325 of the transfer transistor gate 330. The impurity doped source/drain region 305 and impurity doped source/drain region 325 can be formed by any conventional methods known in the art.

It should be appreciated that if desired, the pinned photodiode 311 can be formed after the spacer etch rather than after gate stack formation (FIG. 9C). In this alternative embodiment, after the spacer etch, a bare silicon substrate 302 (not illustrated) would result. The subsequent implant energies used to form the photodiode 311 could then be accordingly decreased, if desired, since the regions are being formed without implanting through an oxide layer.

The CMOS pixel cell 300 is then processed to produce an operative pixel by conventional processing methods that form insulating, shielding, and metallization layers to connect gate lines and other connections to the pixel sensor cells. For instance, as FIG. 9H illustrates, a transparent insulating layer or passivation layer 399, for example, silicon dioxide, BSG, PSG, or BPSG, can be provided over the entire surface which is CMP planarized and etched to provide an opening, and a metal conductor 315 can be used to connect the floating diffusion region 325 with a source follower transistor 50 and row select transistor 60. Additional layers of conductors and insulators may also be used to interconnect the structures and to connect the pixel cell 300 to peripheral circuitry.

Although the above embodiments are described in connection with the formation of p-n-p photodiodes 111, 211, 311, the invention is not limited to these embodiments. The invention also has applicability to photodiodes formed from n-p-n regions in a substrate. The dopant and conductivity types of all structures would change accordingly, with the transfer gate being part of a PMOS transistor, rather than an NMOS transistor as in the embodiments described above.

In addition, although the invention is described in connection with a four-transistor (4T) pixel cell employing a transfer transistor having a transfer gate 130, 230 and 330, the invention may also be incorporated into a three-transistor (3T) cell, a five-transistor (5T) cell, a six-transistor (6T), a seven-transistor (7T), or other pixel configurations.

For instance, a 3T cell differs from the 4T cell by the omission of the charge transfer transistor and associated gate 130, 230 and 330, and the coupling of the n-type regions of the photodiode and the floating diffusion regions through an overlap of the two or an n-type region bridging the two, which is well known in the art. A 5T cell differs from the 4T cell by the addition of a shutter transistor or a CMOS photogate transistor.

The invention described in reference to the pixel cells 100, 200, and 300, reduces undesired effects, such as increased transfer gate leakage, dark current generation, barrier formation, or lag issues associated with conventionally formed pinned photodiodes.

The shallow doping profile pinned photodiode formed before or after source/drain oxidation results in a sharper n-type region profile in the photodiode and provides charge transfer to the transfer gate. The n-type region also eliminates concerns associated with oxidation diffusion.

The graded p-type surface region results in the elimination of the barrier at the edge of the transfer gate in the critical overlap region. The graded p-type surface region also eliminates concerns associated with enhanced diffusion since a lower energy implant is conducted to keep the p-type surface region's doping profile near the transfer gate's edge shallow.

The photodiode's capacitance is increased due to the shallow implants. For instance, the angled implantations used to form photodiode's 111, 211 and 311 are conducted prior to space oxide deposition 195, 295, 395. This allows for separate optimization of the photodiode's 111, 211 and 311 for image performance and the transistor spacer process for transistor performance.

It should be appreciated that in regards to imager cells 100, 200 and 300 described above, the $V_{pin}$ of imager cells 100, 200 and 300 are set by the sum of the p-type implants and n-type implant that forms the photodiodes 111, 211 and 311. However, the $V_{pin}$ or pinning voltage of imager cells 100, 200 and 300 is primarily set by the p+ type implant that forms photodiodes 111, 211 and 311.

It should also be appreciated although implant dose concentrations are provided in atoms/cm$^2$, the dopant concentration can be roughly calculated by multiplying the implant dose concentrations by a factor of $1.0 \times 10^4$ to achieve a dopant concentration in atoms/cm$^3$. It should also be appreciated that the function of the energy of the implant, the depth of diffusion, and the implant profile also will affect the dopant concentration.

Figure 10:
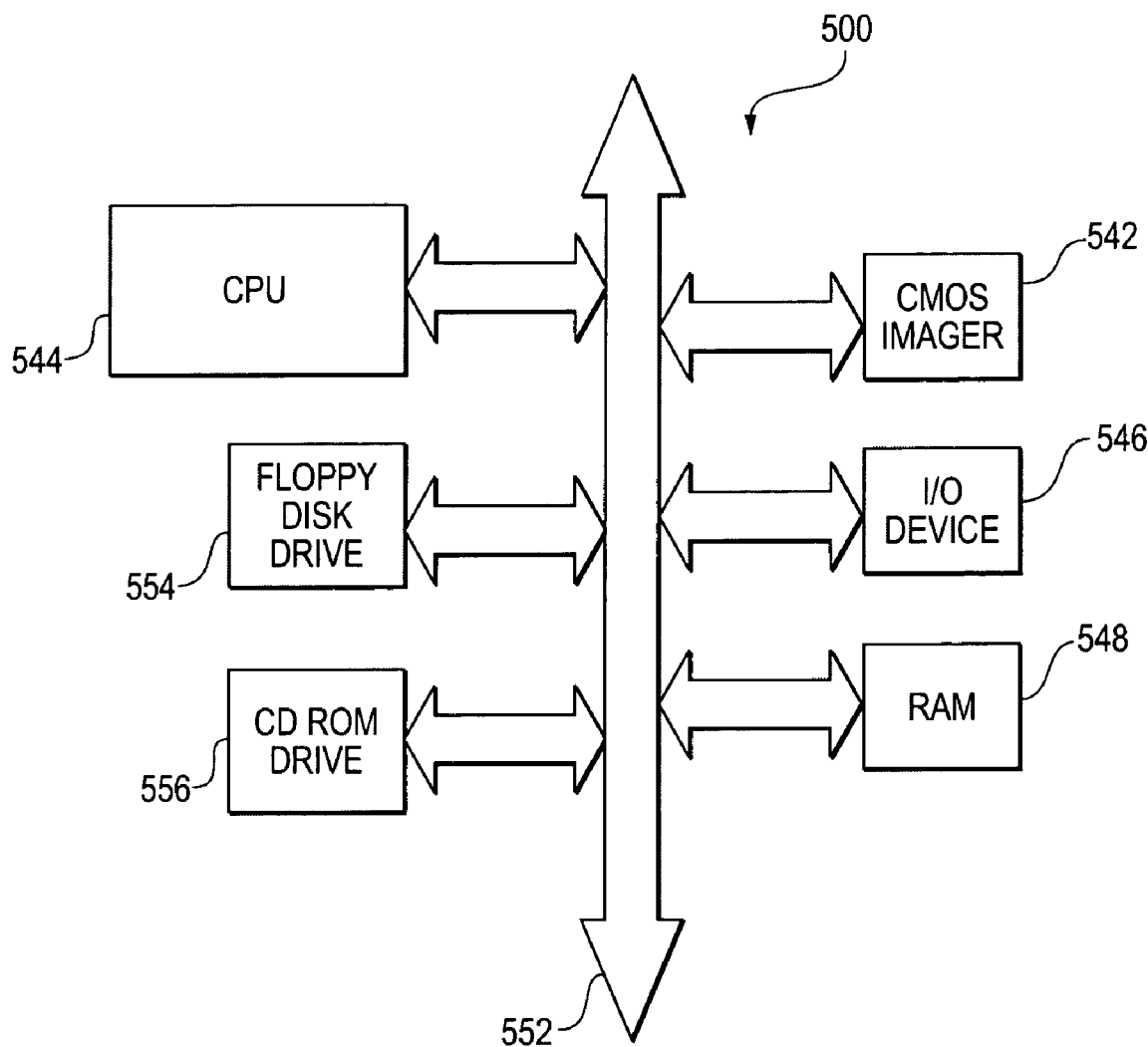
FIG. 10 illustrates a processing system including a CMOS imager containing an embodiment of the invention.

A typical processor based system which includes a CMOS imager device 542 having a pixel array in which the pixels are constructed according to the present invention is illustrated generally at 500 in FIG. 10. The imager device produces an output image signal from signals supplied from the pixel array. A processor based system is exemplary of a system receiving the output of a CMOS imager device. Without being limiting, such a system could include a computer system, camera system, scanner, machine vision system, vehicle navigation system, video phone, surveillance system, auto focus system, star tracker system, motion detection system, image stabilization system, all of which can utilize the present invention.

A processor based system, such as a computer system, for example generally comprises a central processing unit (CPU) 544, for example, a microprocessor, that communicates with an input/output (I/O) device 546 over a bus 552. The CMOS imager device 542 also communicates with components of the system over bus 552 or other communication link. The computer system 500 also includes random access memory (RAM) 548, and, in the case of a computer system may include peripheral devices such as a floppy disk drive 554 and a compact disk (CD) ROM drive 556 which also communicate with CPU 544 over the bus 552. It may also be desirable to integrate the processor 554, CMOS imager device 542 and memory 548 on a single IC chip.

The above description and drawings are only to be considered illustrative of exemplary embodiments which

What is claimed as new and desired to be protected by Letters Patent of the United States is:

1. A photoconversion device comprising:
a substrate having a surface;
a doped region in said substrate and at said surface thereof, said doped region being of a first conductivity type and having a graded profile, wherein said doped region has a higher dopant concentration near the surface of the substrate, comprises a first sub-region doped to a first dopant concentration and a second sub-region doped to a second dopant concentration and a third sub-region adjacent to said first and second doped sub-regions, wherein said third sub-region is doped the same as said substrate; and
a charge accumulation region in said substrate and substantially below said doped region, said charge accumulation region being of a second conductivity type, said third sub-region separating said first and second doped sub-regions from said charge accumulation region and a transistor gate.

2. The photoconversion device of claim 1, wherein said first conductivity type is p-type.

3. The photoconversion device of claim 1, wherein said second conductivity type is n-type.

4. The photoconversion device of claim 1, wherein said first dopant concentration is a p+ dopant concentration.

5. The photoconversion device of claim 1, wherein said first dopant concentration is from about $2.0 \times 10^{13}/cm^2$ to about $1.0 \times 10^{14}/cm^2$.

6. The photoconversion device of claim 5, wherein said first dopant concentration is from about $6.0 \times 10^{12}/cm^2$ to about $5.0 \times 10^{13}/cm^2$.

7. The photoconversion device of claim 1, wherein said second dopant concentration is from about $1.0 \times 10^{12}/cm^2$ to about $6.0 \times 10^{13}/cm^2$.

8. The photoconversion device of claim 7, wherein said second dopant concentration is from about $3.0 \times 10^{12}/cm^2$ to about $4.0 \times 10^{13}/cm^2$.

9. The photoconversion device of claim 4, wherein a pinning voltage for said photoconversion device is substantially set by said first sub-region.

10. The photoconversion device of claim 1, wherein said graded profile is established by said first dopant concentration being greater than said second dopant concentration.

11. The photoconversion device of claim 1, wherein said first doped sub-region is spaced farther from said transistor gate than said second doped sub-region.

12. The photoconversion device of claim 1, wherein said first and second doped sub-regions comprise $BF_2$ or Indium ions.

13. The photoconversion device of claim 1, wherein said doped region and said charge accumulation region are part of a photodiode.

14. The photoconversion device of claim 1, wherein said second doped sub-region has a shallower doping profile with respect to said substrate surface than said first doped sub-region.

15. The photoconversion device of claim 1, wherein said photoconversion device is part of a CMOS imager.

16. The photoconversion device of claim 15, wherein said CMOS imager is a 3T, 4T, 5T, 6T, or 7T device.

17. The photoconversion device of claim 1, wherein said photoconversion device is part of a CCD imager.

18. The photoconversion device of claim 1, wherein said charge accumulation region comprises arsenic, antimony, or phosphorus ions.

19. A photoconversion device comprising:
a substrate having a surface and a substrate dopant concentration;
a first region of said substrate, said first region being doped to a first conductivity type and at least partially located at the surface of the substrate;
a second region of said substrate, said second region being adjacent to said first region, said second region having a dopant concentration substantially the same as said substrate dopant concentration; and
a third region of said substrate, said third region doped to a second conductivity type, located substantially beneath said first region with respect to said substrated surface, separated from said first region by said second region, configured to collect photogenerated charge, and wherein a neck portion of said third region extends to and at least partially below a transistor gate the surface of said substrate.

20. The photoconversion device of claim 19, wherein said first conductivity type is p-type.

21. The photoconversion device of claim 19, wherein said second conductivity type is n-type.

22. The photoconversion device of claim 19, wherein said first doped region has a first dopant concentration.

23. The photoconversion device of claim 19, wherein said second region has a dopant concentration of said first conductivity type no greater than a dopant concentration of non-active portions of said substrate.

24. The photoconversion device of claim 22, wherein said first dopant concentration is a p+ dopant concentration.

25. The photoconversion device of claim 24, wherein said first dopant concentration is from about $2.0 \times 10^{12}/cm^2$ to about $1.0 \times 10^{14}/cm^2$.

26. The photoconversion device of claim 25, wherein said first dopant concentration is from about $6.0 \times 10^{12}/cm^2$ to about $5.0 \times 10^{13}/cm^2$.

27. The photoconversion device of claim 19, wherein said first doped region comprises $BF_2$ or Indium ions.

28. The photoconversion device of claim 19, wherein said photoconversion device is part of a CMOS imager.

29. The photoconversion device of claim 28, wherein said CMOS imager is a 3T, 4T, 5T, 6T, or 7T device.

30. The photoconversion device of claim 19, wherein said photoconversion device is part of a CCD imager.

31. The photoconversion device of claim 19, wherein said third region of said substrate comprises arsenic, antimony, or phosphorus ions.

32. The photoconversion device of claim 19, wherein said second region of said substrate separates said first region from said neck of said third region.

33. The photoconversion device of claim 19, wherein said second region of said substrate separates said first region from said transistor gate.

34. The photoconversion device of claim 33, wherein said first region has a higher concentration of dopant ions of said first conductivity type nearer the surface of said substrate relative to portions of said first region farther from said surface of said substrate.

35. A photoconversion device comprising:
- a substrate having a surface and a substrate dopant concentration;
- a first region of said substrate doped to a first conductivity type and located at and below the surface of the substrate, said region having a dopant gradient profile wherein said dopant is in higher concentrations nearer said surface of said substrate relative to portions of said first region deeper within said substrate;
- a second region of said substrate doped to a second conductivity type, located substantially beneath said first doped region relative to said surface and extending to said surface below a transistor gate, said second region being configured with said first region for generating charge from light exposure and collecting photogenerated charges; and
- a third region of said substrate, said third region having a dopant concentration substantially the same as said substrate dopant concentration and separating said first and second regions from each other and separating said first region from said transistor gate.

* * * * *

UNITED STATES PATENT AND TRADEMARK OFFICE
CERTIFICATE OF CORRECTION

| | | |
|---|---|---|
| PATENT NO. | : 7,148,528 B2 | Page 1 of 1 |
| APPLICATION NO. | : 10/695160 | |
| DATED | : December 12, 2006 | |
| INVENTOR(S) | : Howard E. Rhodes | |

It is certified that error appears in the above-identified patent and that said Letters Patent is hereby corrected as shown below:

Column 25, line 44, "it,is" should read --it is--.

Column 32, line 26, "substrated" should read --substrate--.

Signed and Sealed this

Third Day of April, 2007

JON W. DUDAS
*Director of the United States Patent and Trademark Office*